US012266423B2

(12) United States Patent
Sugahara

(10) Patent No.: US 12,266,423 B2
(45) Date of Patent: Apr. 1, 2025

(54) SEMICONDUCTOR MEMORY DEVICE AND MEMORY SYSTEM

(71) Applicant: Kioxia Corporation, Tokyo (JP)

(72) Inventor: Akio Sugahara, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 386 days.

(21) Appl. No.: 17/749,364

(22) Filed: May 20, 2022

(65) Prior Publication Data

US 2022/0284935 A1 Sep. 8, 2022

Related U.S. Application Data

(63) Continuation of application No. PCT/JP2019/046916, filed on Nov. 29, 2019.

(51) Int. Cl.
G11C 7/22 (2006.01)
G11C 7/10 (2006.01)
G11C 16/20 (2006.01)

(52) U.S. Cl.
CPC ............ G11C 7/222 (2013.01); G11C 7/1048 (2013.01); G11C 7/1063 (2013.01); G11C 7/109 (2013.01); G11C 16/20 (2013.01)

(58) Field of Classification Search
CPC ..... G11C 7/222; G11C 7/1048; G11C 7/1063; G11C 7/109; G11C 16/20; G11C 8/12; G11C 5/04

See application file for complete search history.

(56) References Cited

U.S. PATENT DOCUMENTS

| | | | |
|---|---|---|---|
| 6,847,575 B2 | 1/2005 | Ayukawa et al. | |
| 7,196,950 B2 | 3/2007 | Kanda et al. | |
| 8,819,377 B2 | 8/2014 | Oh et al. | |
| 9,773,527 B2 | 9/2017 | Yamaguchi et al. | |
| 10,418,345 B2 | 9/2019 | Suzuki et al. | |
| 10,957,404 B2 | 3/2021 | Sugahara et al. | |
| 11,257,551 B2 | 2/2022 | Sugahara et al. | |
| 2008/0074930 A1 | 3/2008 | Kanda | |
| 2010/0174866 A1 | 7/2010 | Fujimoto et al. | |
| 2013/0094271 A1* | 4/2013 | Schuetz | G06F 13/4234 365/63 |
| 2013/0250643 A1 | 9/2013 | Matsunaga | |
| 2013/0279253 A1 | 10/2013 | Ogawa et al. | |

(Continued)

FOREIGN PATENT DOCUMENTS

| | | |
|---|---|---|
| JP | 2004152405 A | 5/2004 |
| JP | 2008077779 A | 4/2008 |

(Continued)

OTHER PUBLICATIONS

International Search Report (ISR) (and English translation thereof) dated Feb. 18, 2020, issued in International Application No. PCT/JP2019/046916.

*Primary Examiner* — Jerome Leboeuf

(74) *Attorney, Agent, or Firm* — Holtz, Holtz & Volek PC

(57) ABSTRACT

A semiconductor memory device according to an embodiment includes a first storage circuit. The first storage circuit is configured to store a first unique number uniquely assigned, and a first chip address having a bit number smaller than that of the first unique number and used to identify the semiconductor memory device from other semiconductor memory devices.

14 Claims, 29 Drawing Sheets

(56) References Cited

U.S. PATENT DOCUMENTS

| | | | |
|---|---|---|---|
| 2015/0131397 A1 | 5/2015 | Takeyama et al. | |
| 2017/0075626 A1* | 3/2017 | Kim | G06F 3/0679 |
| 2018/0261260 A1* | 9/2018 | Hirashima | G11C 7/1057 |
| 2022/0130469 A1 | 4/2022 | Sugahara et al. | |

FOREIGN PATENT DOCUMENTS

| | | |
|---|---|---|
| JP | 2013200595 A | 10/2013 |
| JP | 2013222491 A | 10/2013 |
| JP | 2015094997 A | 5/2015 |
| TW | 200917126 A | 4/2009 |
| TW | 201935474 A | 9/2019 |

* cited by examiner

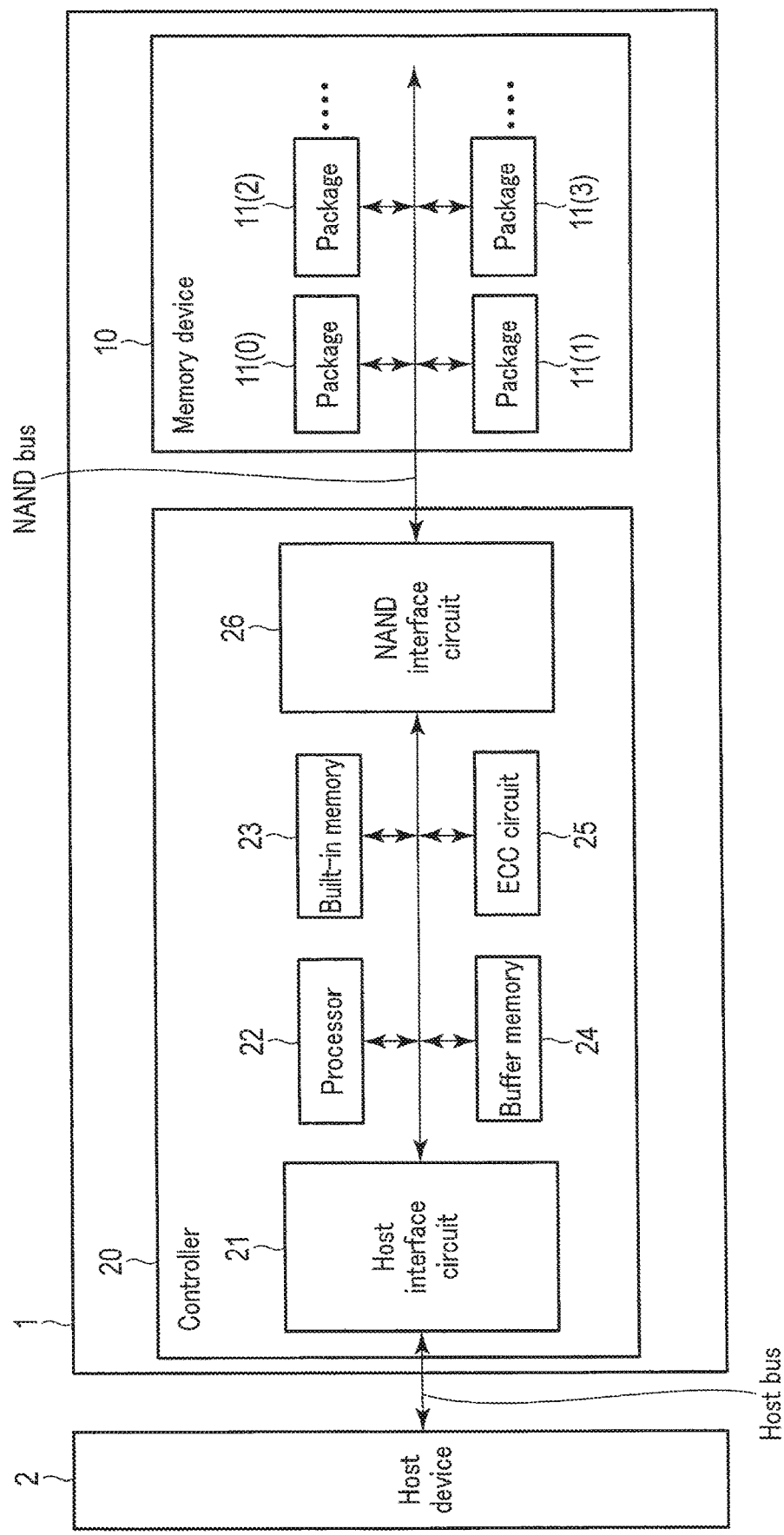
F I G. 1

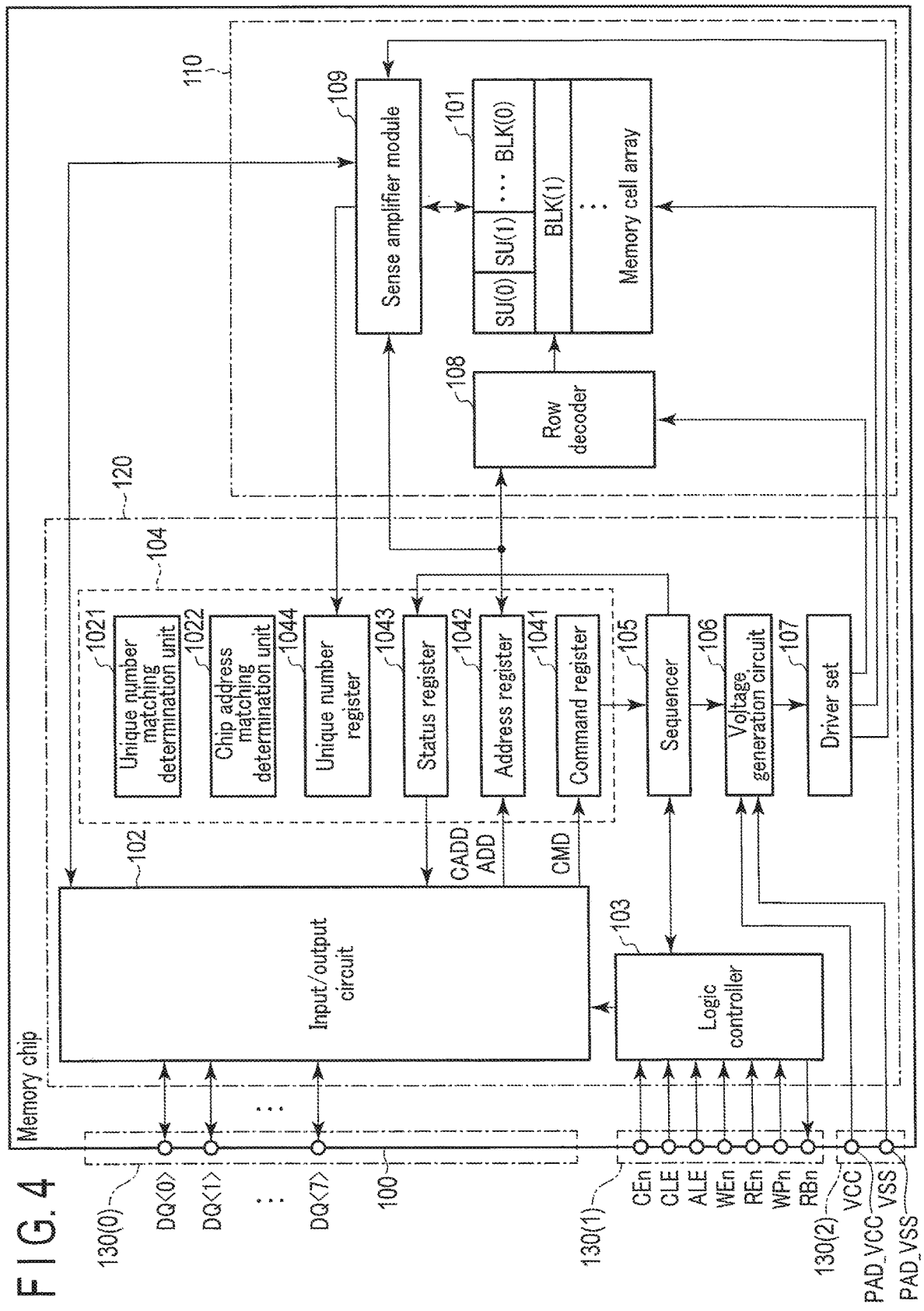
F I G. 4

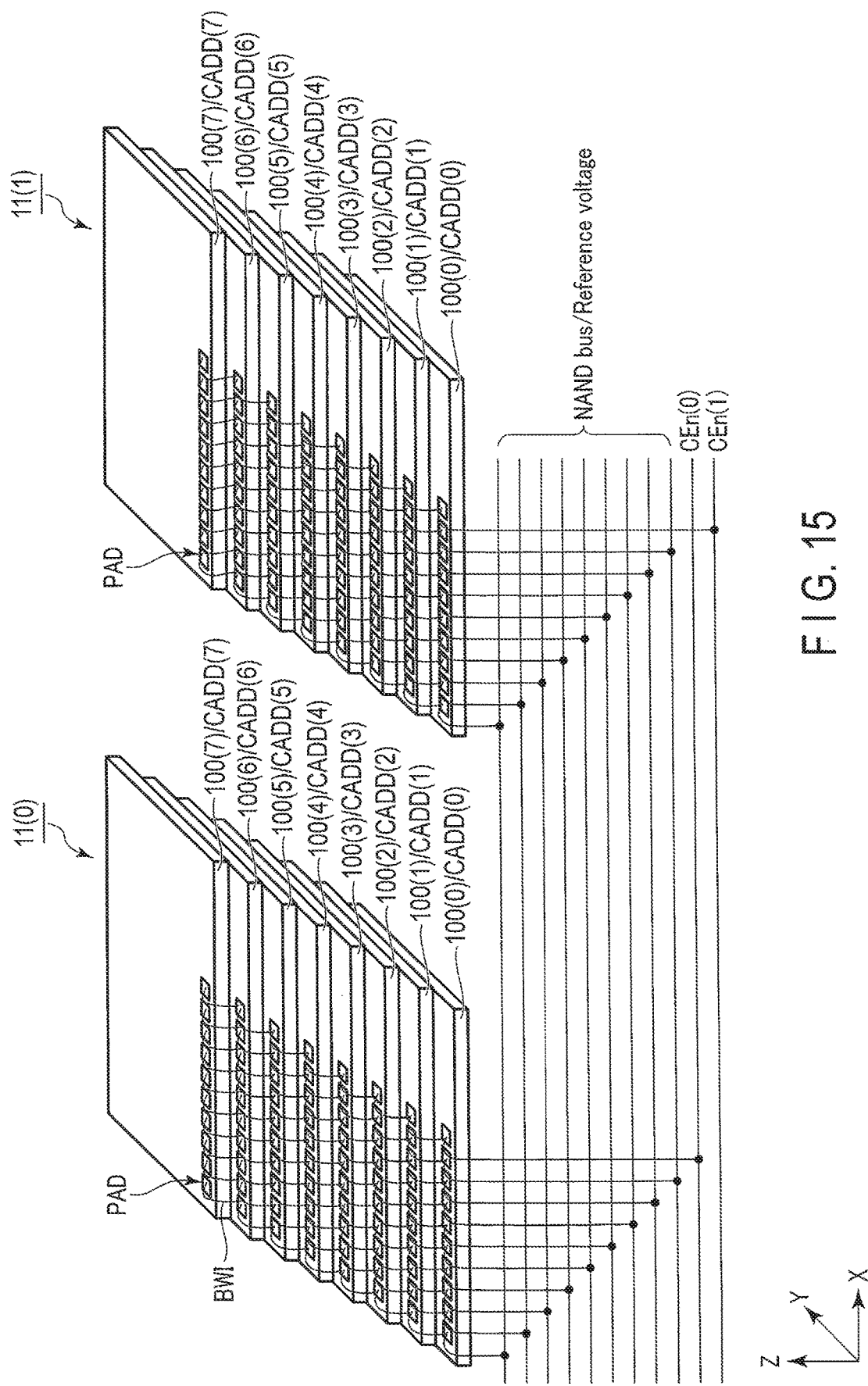
F I G. 15

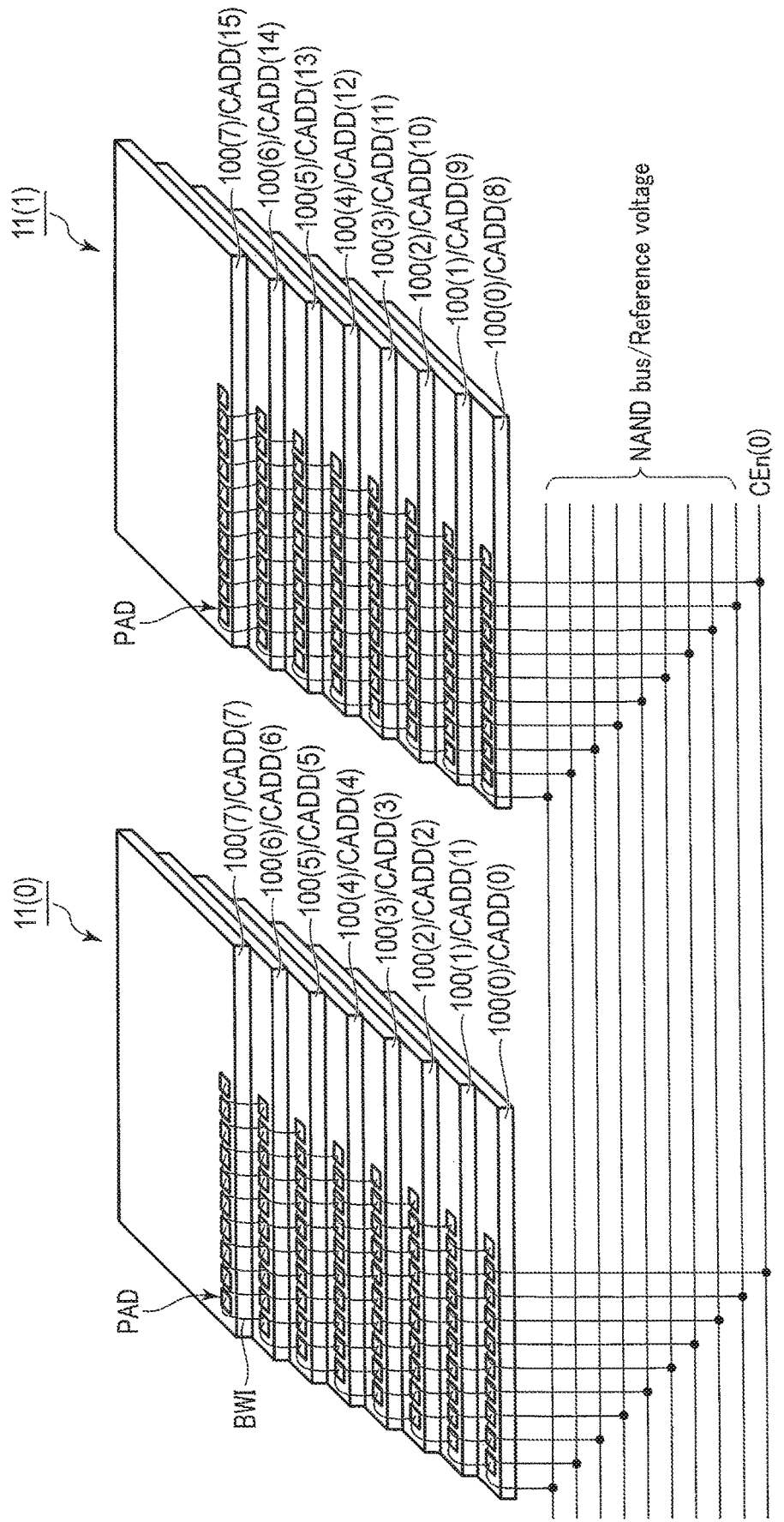
F I G. 16

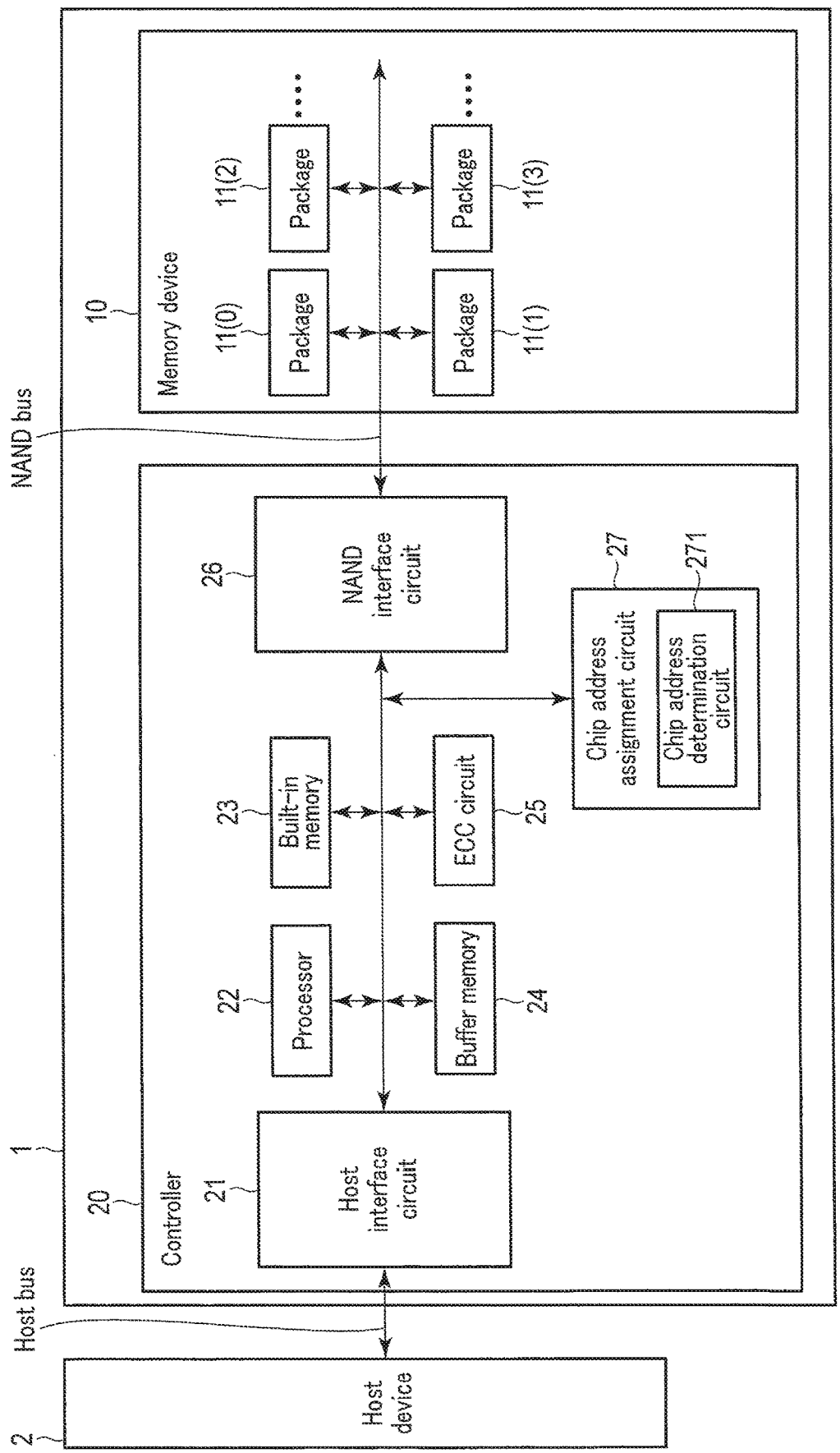
F I G. 19

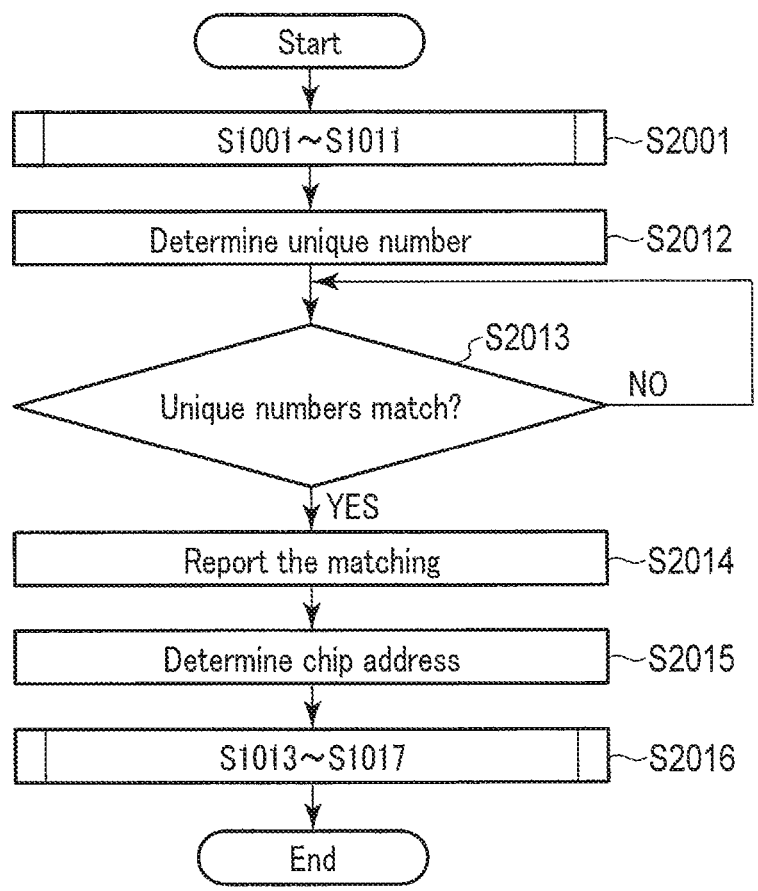
F I G. 20

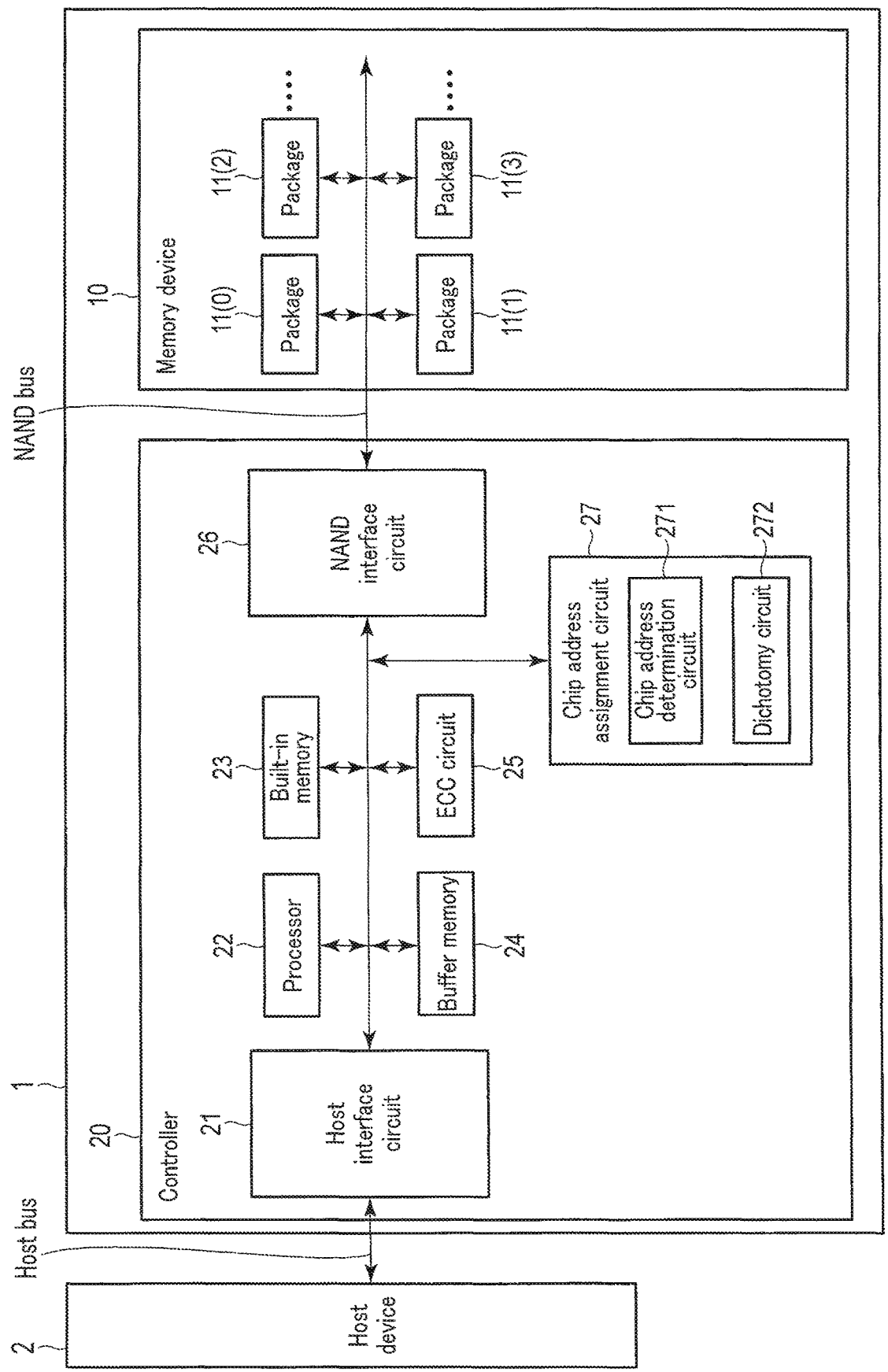
F I G. 23

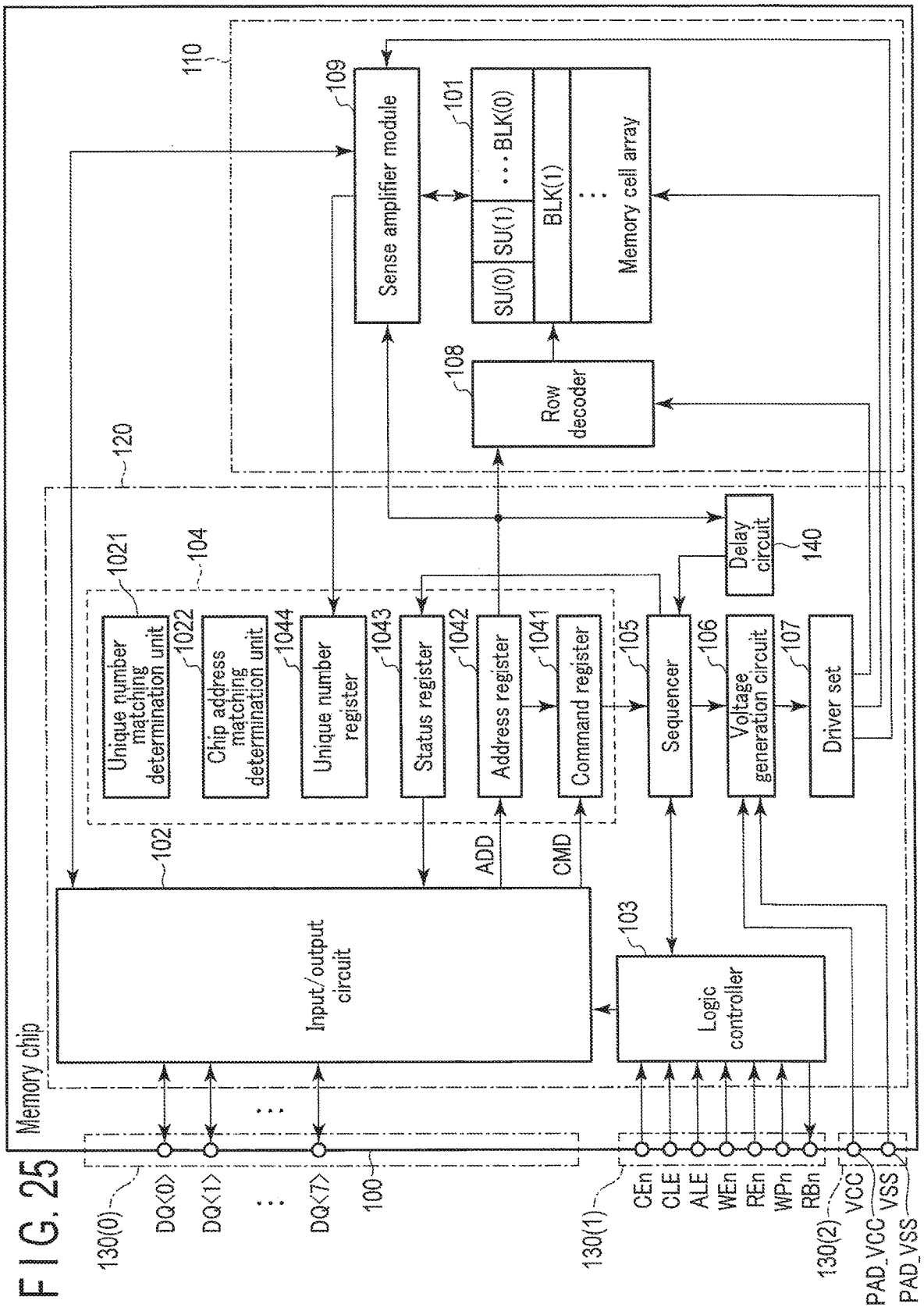
F I G. 25

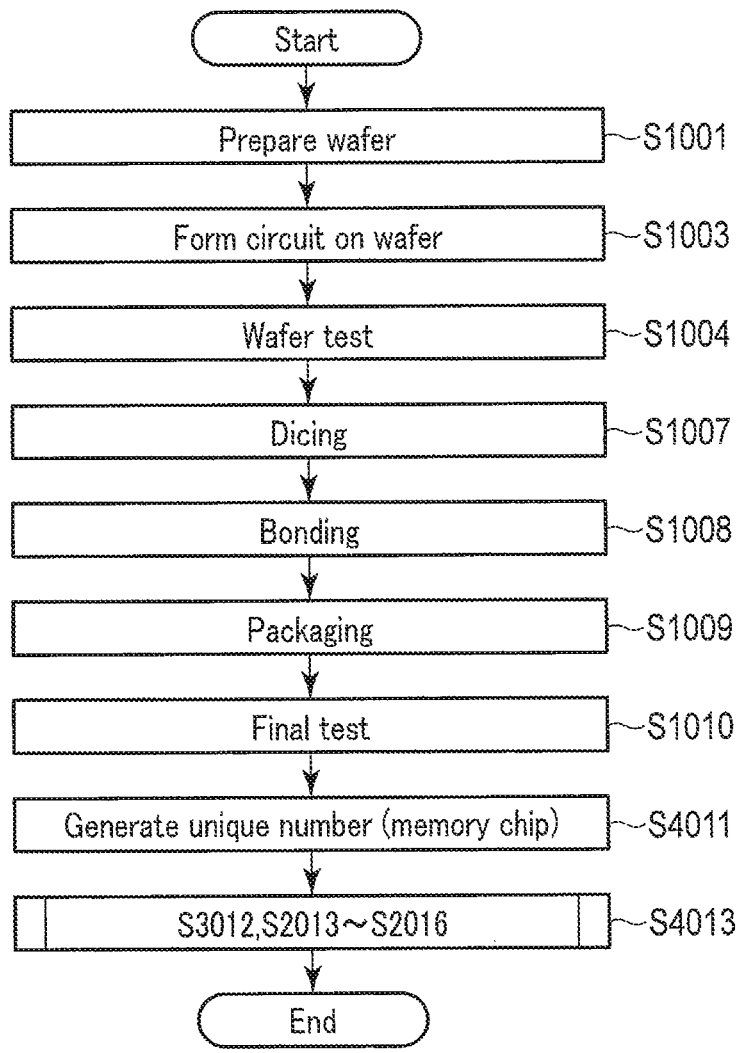
F I G. 30

SEMICONDUCTOR MEMORY DEVICE AND MEMORY SYSTEM

CROSS-REFERENCE TO RELATED APPLICATIONS

This application is a Continuation Application of PCT Application No. PCT/JP2019/046916, filed Nov. 29, 2019, the entire contents of which are incorporated herein by reference.

FIELD

Embodiments described herein relate generally to a semiconductor memory device and a memory system.

BACKGROUND

A NAND flash memory is known as a semiconductor memory device.

BRIEF DESCRIPTION OF THE DRAWING

FIG. 1 is a block diagram showing an example of a configuration of a memory system according to a first embodiment.

FIG. 4 is a block diagram showing an example of the configuration of a memory chip according to the first embodiment.

FIG. 15 is a diagram showing an example of a configuration of a package according to a comparative example.

FIG. 16 is a diagram showing an example of a configuration of a package according to the first embodiment.

FIG. 19 is a block diagram showing the configuration example of the memory system according to the second embodiment.

FIG. 20 is a flowchart illustrating a method of manufacturing a memory system and a method of using a memory system.

FIG. 23 is a block diagram showing the configuration example of the memory system according to a third embodiment.

FIG. 25 is a block diagram showing an example of a configuration of a memory chip according to a fourth embodiment.

FIG. 30 is a flowchart illustrating a method of manufacturing a memory system and a method of using a memory system.

DETAILED DESCRIPTION

Figure 2:
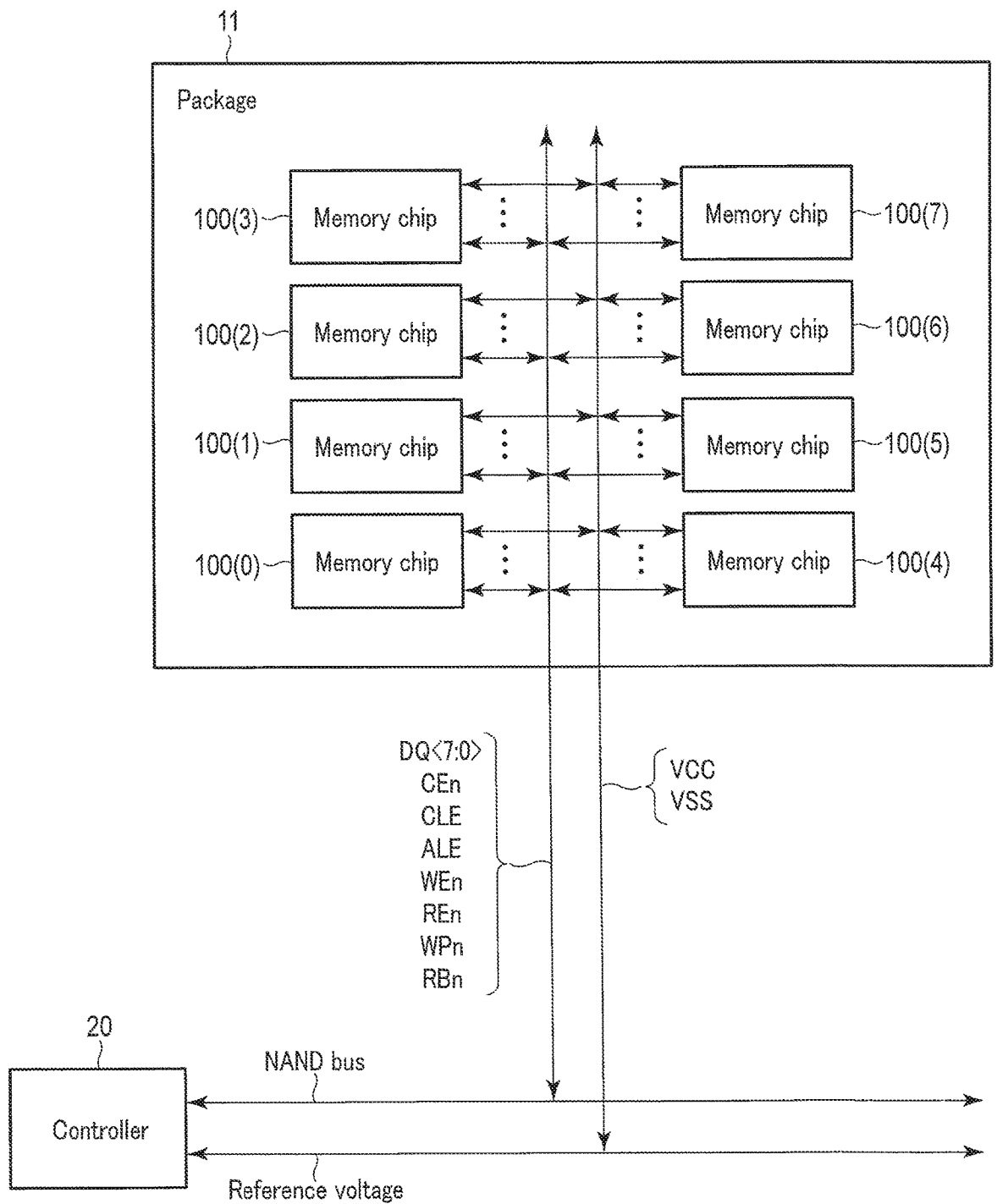
FIG. 2 is a block diagram showing an example of a configuration of a package according to the first embodiment.

In general, according to one embodiment, a semiconductor memory device includes a first storage circuit. The first storage circuit is configured to store a first unique number uniquely assigned, and a first chip address having a bit number smaller than that of the first unique number and used to identify the semiconductor memory device from other semiconductor memory devices.

Hereinafter, embodiments will be described with reference to the drawings. The embodiments exemplify a device and method that realize the technical concept of the invention. The drawings are provided merely for schematic or conceptual purposes, and thus may not be identical to the actual dimensions and proportions. The technical idea of the present invention is not specified by the shapes, structures, arrangements, etc. of the components.

In the description that follows, components having substantially the same functions and configurations will be denoted by the same reference symbols. A numeral following characters constituting a reference symbol is used to distinguish between elements that have the same configuration that are referred to by reference symbols that have the same characters. If elements denoted by reference symbols

<1> First Embodiment

<1-1> Configuration

A configuration of the memory system according to the first embodiment is described.

<1-1-1> Overall Configuration of Memory System

A configuration example of a memory system according to the first embodiment is described with reference to FIG. 1. FIG. 1 is a block diagram showing the configuration example of the memory system according to the embodiment. The memory system 1 is coupled to a host device (which may be referred to as a "host" or an "external device") 2 by a host bus, and functions as an external storage apparatus of the host device 2. The host device 2 may be, for example, an information processing apparatus such as a personal computer, a mobile phone, or an imaging device, or a mobile device such as a tablet computer or a smart phone, a game device, or a vehicle-mounted device such as a car navigation system. The memory system 1 holds data from the host device 2, and reads and outputs data to the host device 2.

As shown in FIG. 1, the memory system 1 has a controller 20 and a memory device (which may be referred to as a "storage unit" or a "memory device") 10. The controller 20 receives an instruction from the host device 2 and controls the memory device 10 based on the received instruction. Specifically, the controller 20 writes data, which the host device 2 instructed the controller 20 to write, in the memory device 10, reads the data, which the host device 2 instructed the controller 20 to read, from the memory device 10, and transmits the data to the host device 2. The controller 20 is coupled to the memory device 10 via a NAND bus. The memory device 10 has a plurality of memory cells and stores data in a non-volatile manner. The memory device 10 is a memory that stores data in a nonvolatile manner. The memory device 10 is, for example, a non-volatile semiconductor memory having a plurality of packages (which may be referred to as "semiconductor storage devices") 11 (in FIG. 1, four packages 11 (11(0), 11(1), 11(2), and 11(3)) are shown).

The memory system 1 may be a memory card comprised of the controller 20 and the memory device 10 as a single package, or a solid state drive (SSD).

The number of packages 11 included in the memory device 10 is not limited to four, and any discretionarily determined number of packages 11 may be provided in the memory device 10.

<1-1-2> Configuration of Controller

The controller 20 of the memory system 1 according to the embodiment is explained with reference to FIG. 1. The memory controller 20 includes, for example, a host interface circuit 21, a central processing unit (CPU) 22, a built-in memory (random access memory, RAM) 23, a buffer memory 24, an error correction code (ECC) circuit 25, and a NAND interface circuit 26.

The host interface circuit 21 is coupled to the host device 2 and controls communication with the host device 2. The host interface circuit 21 may be a universal flash storage (UFS) interface compliant with the UFS standard, a serial attached SCSI (SAS) interface compliant with the SAS standard, or an interface compliant with another standard, or may be a communication cable itself. The host interface circuit 21 transfers, for example, an instruction and data received from the host device 2 to the processor 22 and buffer memory 24, respectively.

The processor 22 controls the operation of the entire controller 20. In response to, for example, a data read instruction received from the host device 2, the processor 22 issues a read instruction based on the NAND interface circuit 26 to the memory device 10. This operation is similar for a write operation and an erase operation. The processor 22 also has a function of executing various arithmetic operations on data that is read from the memory device 10. When the memory system 1 is supplied with power, the processor 22 reads and outputs firmware (a control program) stored in a ROM (not shown) to the buffer memory 24 or the built-in memory 23 and performs predetermined processing so as to control an operation of the entire controller 20. Herein, the processor 22 may be referred to as a core or a processor core. The control of the operation of the entire controller 20 is not necessarily realized by the processor 22 executing the firmware and may be realized by predetermined hardware.

The built-in memory 23 is, for example, a semiconductor memory, such as a DRAM (dynamic RAM), and is used as a work area of the processor 22. The built-in memory 23 temporarily stores firmware for managing the memory device 10, and various management tables, etc.

The buffer memory 24 temporarily stores data, etc. received by the memory controller 20 from the memory device 10 and the host device 2. Specifically, the buffer memory 24 is comprised of a general-purpose memory, such as an SRAM (static RAM) or a DRAM. The buffer memory 24 may be installed within the controller 20 or installed externally and independently from the controller 20.

The ECC circuit 25 performs error detection and error correction processing. Specifically, when data is written, the ECC circuit 13 generates an ECC code for a certain number of data sets based on data received from the host device 2. When data is read, the ECC circuit 13 performs decoding based on the ECC code, and detects whether there is an error. When an error is detected, the ECC circuit 13 specifies a bit location of the error and corrects the error.

The NAND interface circuit 26 is coupled to the memory device 10 via a NAND bus, and governs communications with the memory device 10. In accordance with an instruction from the processor 22, the NAND interface circuit 26 transmits a command CMD, an address ADD, and write data (DATA) to the memory device 10. The NAND interface circuit 26 receives read data (DATA) from the memory device 10.

<1-1-3> Configuration of Package

Next, a configuration example of the package 11 according to the embodiment is described with reference to FIG. 2. FIG. 2 is a block diagram showing an example of a configuration of the package 11 according to the embodiment. For easy understanding, only one package 11 is explained with reference to FIG. 2.

As shown in FIG. 2, the package 11 has a plurality of memory chips (or simply "chips") 100 (eight chips 100(0) to 100(7) in FIG. 2). Each memory chip 100 is independently operable, and a NAND-type flash memory chip is an example of the memory chip 100. Generally, in a NAND-type flash memory chip, data writing and reading is performed in a data unit called a "page", and data erasure is performed in a data unit called a "block". The number of memory chips 100 included in the package 11 is not limited eight, and any discretionarily selected number of memory chips 100 may be included.

Each of the memory chips 100 is coupled to the NAND bus.

The NAND buses are used for transmission and reception of respective signals CEn, CLE, ALE, WEn, REn, WPn, RBn, and DQ<7:0> compatible with a NAND interface, via dedicated signal lines. The signal CEn is a signal for enabling the memory chip 100. The signal CLE notifies the memory chip 100 that the signal DQ<7:0> which flows into the memory chip 100 when the signal CLE is at the "H (high)" level is a command. The signal ALE notifies the memory chip 100 that the signal DQ<7:0> which flows into the memory chip 100 when the signal ALE is at the "H (high)" level is an address. The signal WEn instructs the memory chip 100 to take therein the signal DQ<7:0> which flows into the memory chip 100 when the signal WEn is at the "L (low)" level (L<H). The signal REn instructs the memory chip 100 to output the signal DQ<7:0>. The signal WPn instructs the memory chip 100 not to write or erase data. The signal RBn indicates that the memory chip 100 is either in a ready state (a state of accepting external instructions) or a busy state (a state of not accepting external instructions). The signal DQ<7:0> is, for example, an eight-bit signal. The DQ<7:0> is an entity of data transmitted and received between the memory chip 100 and the controller 20, and includes a command (CMD), an address (ADD), and data (DATA). The data (DATA) includes write data and read data.

As a reference voltage, voltages VCC and VSS are externally supplied to the memory chip 100, for example. The voltage VCC is, for example, a power supply voltage to drive the memory chip 100, and the voltage VSS is, for example, a ground voltage and lower than the voltage VCC.

<1-1-4> Relationship Between Memory Chips

Figure 3:
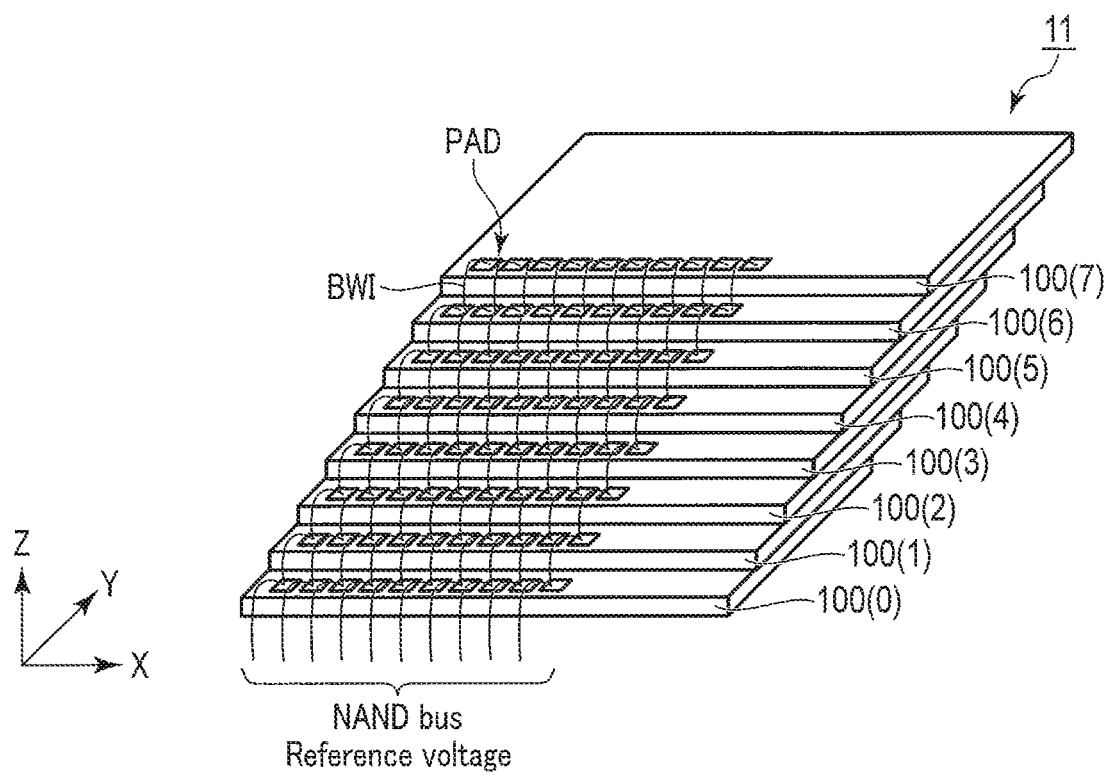
FIG. 3 is a block diagram showing an example of the relationship between memory chips included in a package according to the first embodiment.

Next, the relationship between the memory chips 100 included in the package 11 according to the first embodiment is described with reference to FIG. 3. FIG. 3 is a block diagram showing an example of the relationship between the memory chips 100 included in the package 11 according to the embodiment. For easy understanding, a sealing resin included in the package 11 and a substrate on which each memory chip 100 is stacked are omitted in FIG. 3.

As shown in FIG. 3, a plurality of memory chips 100 included in the package 11 are stacked in a stepwise manner. Furthermore, the plurality of memory chip 100 are arranged in such a manner that a plurality of pads (ten pads in FIG. 3 for simplification) that are provided on the edge of each memory chip 100 are exposed.

Each pad provided in the memory chip 100 receives a signal relating to a NAND bus for operating the memory chip 100 or a reference voltage and transmits a signal to the controller 20. In other words, the pads are provided according to the number of signals transmitted to and received from the memory chip 100, and the number of voltages received by the memory chip 100. The pads are, for example, electrode terminals. Among the plurality of memory chips 100, the pads that receive the same signal or voltage are electrically coupled to each other by a bonding wire BWI. Each bonding wire BWI is an external interconnect containing gold (Au), and functions as a transmission path for a power supply voltage and signals between the memory chip 100 and each corresponding pad. Each bonding wire BWI is stationarily fixed by a sealing resin (not shown), and is insulated from elements except for the coupling points to the memory chips 100 and the coupling points to the corresponding pads.

As shown in FIG. 3, each pad of a memory chip 100 is coupled to a pad in another memory chip having the same function, via a bonding wire BWI. In other words, the pads having the same function in the plurality of memory chips 100 included in the package 11 are coupled in common. In other words, the same signal is input to the plurality of memory chips 100 included in the package 11.

Specifically, a pad that receives the signal CEn in the memory chip 100(0) and a pad that receives the signal CEn in the memory chip 100(1) are coupled via a bonding wire BWI. Similarly, a pad that receives the signal CEn in the memory chip 100(1) and a pad that receives the signal CEn in the memory chip 100(2) are coupled via a bonding wire BWI. A pad that receives the signal CEn in the memory chip 100(2) and a pad that receives the signal CEn in the memory chip 100(3) are coupled via a bonding wire BWI. A pad that receives the signal CEn in the memory chip 100(3) and a pad that receives the signal CEn in the memory chip 100(4) are coupled via a bonding wire BWI. A pad that receives the signal CEn in the memory chip 100(4) and a pad that receives the signal CEn in the memory chip 100(5) are coupled via a bonding wire BWI. A pad that receives the signal CEn in the memory chip 100(5) and a pad that receives the signal CEn in the memory chip 100(6) are coupled via a bonding wire BWI. A pad that receives the signal CEn in the memory chip 100(6) and a pad that receives the signal CEn in the memory chip 100(7) are coupled via a bonding wire BWI. In other words, pads that receive the signal CEn in the memory chips 100(0) to 100(7) are coupled in series via bonding wires BWI.

The same applies to the pads relating to the other signals or voltages.

<1-1-5> Configuration of Memory Chip

Next, a configuration example of the memory chip 100 according to the first embodiment is described. FIG. 4 is a block diagram showing an example of the configuration of the memory chip 100 according to the first embodiment.

As shown in FIG. 4, the memory chip 100 includes a core circuit 110, a peripheral circuit 120, an input and output pad group 130(0), a logic control pad group 130(1), and a power source pad group 130(2).

The peripheral circuit 120 includes an input/output circuit 102, a logic controller 103, a register 104, a sequencer 105, a voltage generation circuit 106, and a driver set 107.

The core circuit 110 includes a memory cell array 101, a row decoder 108, and a sense amplifier module 109.

The memory cell array 101 includes a plurality of blocks BLK (BLK(0), BLK(1), . . . ). The block ELK includes a plurality of nonvolatile memory cell transistors (not shown), each of which is associated with a bit line and a word line. A block BLK is a unit of data erasure, for example. Data in the same block BLK is collectively erased. Each block BLK includes a plurality of string units SU (SU(0), SU(1), . . . ). The number of blocks in the memory cell array 101 and the number of string units in each block BLK may be set to any number.

The input/output circuit 102 transmits and receives the signal DQ<7:0> to and from the controller 20. The input/output circuit 102 transfers a command (CMD) in the signal DQ<7:0> to the command register 1041 in the register 104. The input/output circuit 102 transfers an address (ADD) in the signal DQ<7:0> to the address register 1042 in the register 104. The input/output circuit 102 transmits and receives write data and read data to and from the sense amplifier module 109.

The logic controller circuit 103 receives the signals CEn, CLE, ALE, WEn, REn, and WPn from the controller 20. The logic control circuit 103 transfers the signal RBn to the controller 20 to externally report the status of the memory chip 100.

The register 104 includes a command register 1041, an address register 1042, a status register 1043, a unique number register 1044, a unique number matching determination unit 1021, and a chip address matching determination unit 1022.

The command register 1041 receives and stores a command (CMD) from the input/output circuit 102. The command register 1041 transfers the command (CMD) to the sequencer 105.

The address register 1042 receives and stores an address (ADD) from the input/output circuit 102. The address register 1042 transfers the address (ADD) to the row decoder 108 and the sense amplifier module 109.

The address register 1042 stores a chip address CADD that is read from the memory cell array 101. The address register 1042 transmits the chip address CADD to the chip address matching determination unit 1022 based on an external request (from the controller 20, for example).

The status register 1043 receives and stores various types of status information from the sequencer 105. The status register 1043 externally transmits various types of status information via the input/output circuit 102 based on an external request (from a controller 20, for example).

The unique number matching determination unit 1021 determines whether or not a unique number (individual ID number, unique number, ID number, or serial number) stored in the unique number register 1044 in the register 104 matches a unique number received from the outside (from the controller 20, for example). The unique number matching determination unit 1021 is configured to externally report the determination result. The unique number matching determination unit 1021 is for example a circuit. The unique number may be any number as long as a memory chip 100 can be uniquely identified by the number. Specific examples of the unique number will be described later.

The chip address matching determination unit 1022 determines whether or not a chip address CADD stored in the address register 1042 in the register 104 matches a chip address CADD received externally (from the controller 20, for example). The chip address matching determination unit 1022 is configured to be capable of externally notifying the determination result. As a specific example, after a command for selecting a memory chip 100 is received by the input/output circuit 102, if the command is a status command, the chip address matching determination unit 1022 reports a determination result to the controller 20. The chip address matching determination unit 1022 is for example a logic circuit. More specifically, the chip address matching determination unit 1022 is a logic circuit that includes an XNOR circuit that performs XNOR computation for each bit on a chip address CADD stored in the address register 1042 and an externally received chip address CADD, and an AND circuit that performs an AND computation on an computation result that is output from the XNOR circuit. A chip address CADD is an address for identifying a memory chip 100. Specifically, a command set including a chip address CADD is received, and if chip addresses CADD match, the command set is performed. The bit number of a chip address CADD is smaller than the bit number of a unique number. A chip address CADD differs from the signal CEn.

The unique number register 1044 stores a unique number that is read from the memory cell array 101. The unique number register 1044 transmits a unique number to the unique number matching determination unit 1021 based on an external request (from the controller 20, for example).

The sequencer 105 receives a command (CMD), and controls an entire memory chip 100 in accordance with a sequence that is based on the received command (CMD).

The voltage generation circuit 106 generates voltages necessary for various operations, such as data write, read, and erase, based on an instruction from the sequencer 105. The voltage generation circuit 106 supplies a generated voltage to the driver set 107.

The driver set 107 includes a plurality of drivers, and supplies various voltages from the voltage generation circuit 106 to the memory cell array 101, the row decoder 108 and the sense amplifier module 109 based on the address from the register 104.

The row decoder 108 receives from the register 104 a row address included in an address ADD, and selects a block BLK or the like based on, for example, a block address in the row address. A voltage from each driver set 107 is transferred to the selected block BLK via the row decoder 108.

When data is read, the sense amplifier module 109 senses data that is read from a memory cell transistor and output to a bit line, and transfers the sensed read data to the input/output circuit 102. When data is written, the sense amplifier module 109 transfers write data slated to be written via a bit line to a memory cell transistor. The sense amplifier module 109 also receives a column address in the address (ADD) from the register 104, and outputs data of a column based on the column address.

The input and output pad group 130(0) transfers the signal DQ<7:0> received from the controller 20 to the input/output circuit 102. The input and output pad group 130(0) transfers the signal DQ<7:0> transmitted from the input/output circuit 102 to the outside of a memory chip 100.

The logic control pad group 130(1) transfers the signals CEn, CLE, ALE, WEn, REn, and WPn received from the controller 20 to the logic controller 103. The logic control pad group 130(1) transfers the signal RBn transmitted from the logic controller 103 to the outside of a memory chip 100.

The power source pad group 130(2) transfers the externally supplied voltages VCC and VSS to a plane PB. Specifically, the power source pad group 130(2) includes pads PAD_VCC and PAD_VSS. The pads PAD_VCC and PAD_VSS supply the voltages VCC and VSS to the memory chip 100, respectively.

<1-1-6> Configuration of Memory Cell Array

Figure 5:
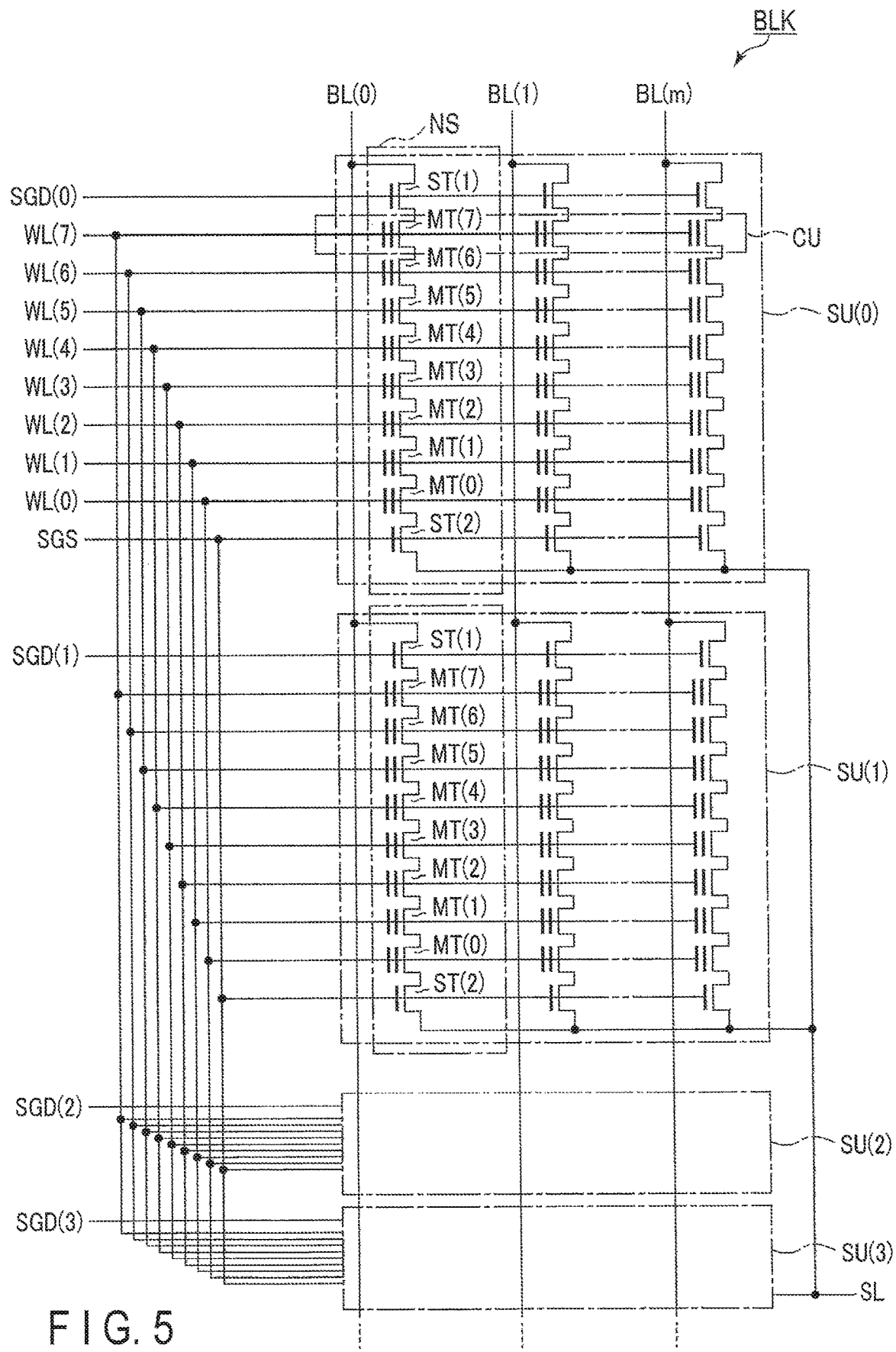
FIG. 5 is an example circuit diagram for explaining a single block in a memory cell array of a memory chip according to the first embodiment.

Next, a configuration of the memory cell array of the memory chip according to the embodiment is described with reference to FIG. 5. FIG. 5 is an example circuit diagram for explaining a single block in a memory cell array of a memory chip according to the embodiment.

As shown in FIG. 5, each block ELK includes, for example, four string units SU(0) to SU(3). Each of the string units SU includes a plurality of NAND strings NS.

A plurality of NAND strings NS are respectively associated with bit lines BL(0) through BL(m) (m is an integer equal to or greater than 1). Each NAND string NS includes, for example, memory cell transistors MT(0) to MT(7) and select transistors ST(1) and ST(2).

Each memory cell transistor MT includes a control gate and a charge storage layer, and stores data in a non-volatile manner. Each of the select transistors ST(1) and ST(2) is used to select a string unit SU at the time of performing various operations.

The drain of the select transistor ST(1) of each NAND string NS is coupled to an associated bit line BL. The memory cell transistors MT(O) to MT(7) are coupled in series between a source of the select transistor ST(1) and a drain of the select transistor ST(2).

The gates of the select transistors ST(1) respectively included in string units SU(O) through SU(3) in the same block BLK are respectively coupled in common to select gate lines SGD(0) through SGD(3). The control gates of the memory cell transistors MT(0) to MT(7) are coupled in common to the word lines WL(0) to WL(7), respectively. The gates of the select transistors ST(2) are coupled in common to the select gate line SGS.

Different column addresses are assigned to the bit lines BL(0) to BL(m), respectively. Each line BL is coupled to the select transistors ST(1) of corresponding NAND strings NS in common between blocks (BLK). Each of the word lines WL(0) to WL(7) is provided for each block BLK. The source line SL is shared among a plurality of blocks ELK, for example.

A set of memory cell transistors MT coupled to a common word line WL in a single string unit SU is referred to as, for example, a cell unit CU. The storage capacity of a cell unit CU including memory cell transistors MT that individually store 1-bit data, for example, is defined as "1-page data". The cell unit CU can have a storage capacity of 2-page data or more in accordance with the number of bits of data stored in the memory cell transistors MT.

The above-described configuration of the memory chip 100 is merely a non-restrictive example. For example, the numbers of memory cell transistors MT, select transistors ST(1), and select transistors ST(2) in each NAND string NS may be any number. The number of string units SU included in each block ELK may be determined as appropriate. The arrangement and the number of transistors used as a dummy transistor may be discretionarily designed.

<1-2> Manufacturing Method and Using Method

Subsequently, a method of manufacturing the memory system 1 and a method of using the memory system 1 are described, with reference to the flowchart shown in FIG. 6.

Figure 6:
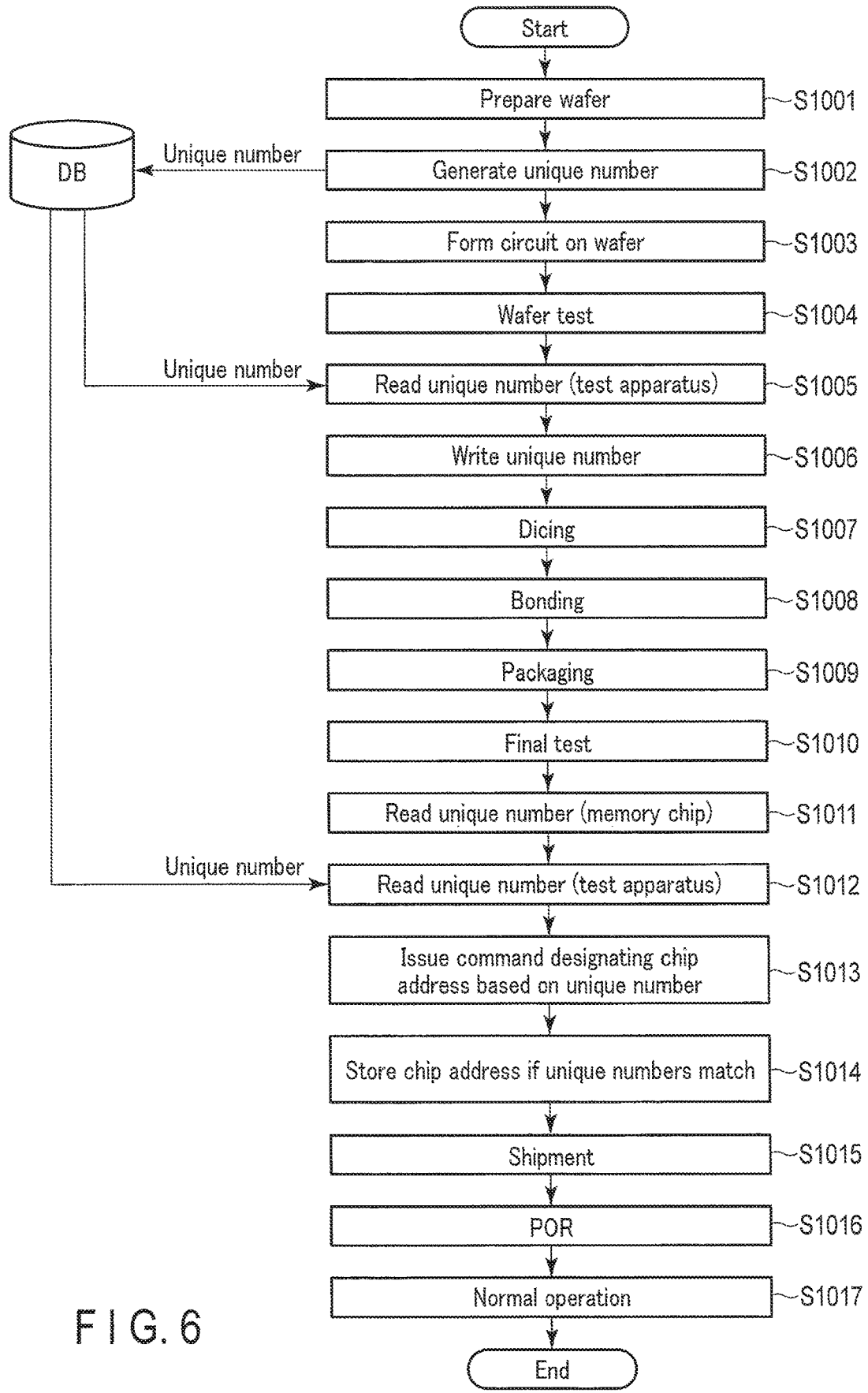
FIG. 6 is a flowchart illustrating a method of manufacturing a memory system and a method of using a memory system.

FIG. 6 is a flowchart illustrating a method of manufacturing the memory system 1 and a method of using the memory system 1.

[S1001]

Figure 7:
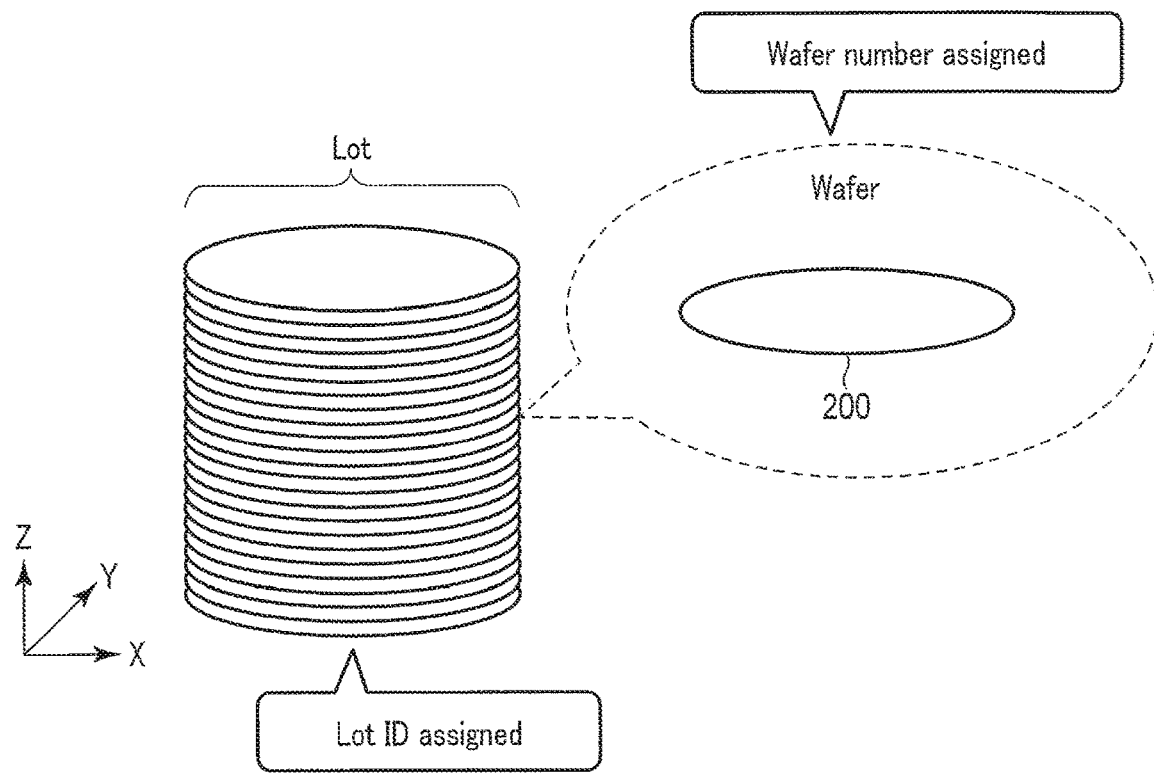
FIG. 7 is a diagram schematically showing an outer appearance of a wafer and a lot.

Step S1001 is explained with reference to FIG. 7. FIG. 7 is a diagram schematically showing an outer appearance of a wafer and a lot.

In step S1001, a wafer (silicon wafer) 200 is prepared. Specifically, a wafer 200 having an approximately disc shape is generated by thinly slicing a silicon single crystal ingot. A diameter of the wafer 200 is, for example, 200 mm, 300 mm, or 450 mm. As described later, a plurality of memory chips 100 are formed on this wafer 200. When memory chips 100 are formed, a plurality of wafers 200 are processed in a batch. A single batch may be called a "lot", for example. One lot includes multiple wafers 200, as shown in FIG. 7. A wafer 200 is given a wafer number to identify a wafer 200 when memory chips 100 are formed. A lot is given a lot ID to identify a lot when memory chips 100 are formed.

[S1002]

Figure 8:
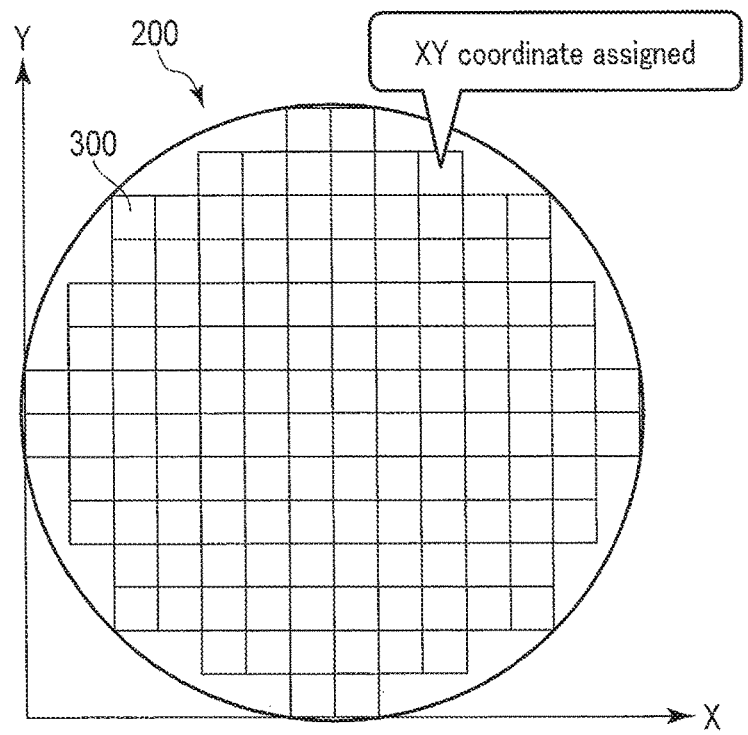
FIG. 8 is a diagram showing a relationship between a wafer and an XY coordinate.

Step S1002 is explained with reference to FIG. 8. FIG. 8 is a diagram showing the relationship between a wafer 200 and an XY coordinate.

In step S1002, a unique number is generated. As shown in FIG. 8, memory chip forming areas 300 in which memory chips 100 are formed in a later step are prepared in the wafer 200. Multiple memory chip forming areas 300 are prepared on the wafer 200. The memory chip forming area 300 is assigned an X coordinate and a Y coordinate (or an XY coordinate, collectively), using an XY coordinate system.

As described above, a lot ID is assigned to each lot, and a wafer number is assigned to each wafer 200. For this reason, each memory chip forming area 300 can be identified by using a lot ID, a wafer number, and an XY coordinate. For this reason, a unique number can be generated based on, for example, a lot ID, a wafer number, and an XY coordinate. A unique number is stored in a database DB, for example. The unique number may be any number as long as a memory chip forming area 300 can be identified by the number. Although memory chips 100 have not yet been formed in step S1002, memory chips 100 will be formed in the memory chip forming areas 300 with a method described later. In other words, a unique number will be used as a number to identify each memory chip 100.

[S1003]

In step S1003, a circuit is formed on a wafer 200. Specifically, various types of processing are performed on the wafer 200 so as to form circuits slated to be memory chips 100 on the memory chip forming areas 300.

[S1004]

In step S1004, a wafer test is conducted. Specifically, before memory chips 100 are cut out from the wafer 200, various tests are conducted as a wafer test by putting a needle (probe) made of an electrically conductive material against a bonding pad to connect the wafer to a tester.

[S1005]

In step S1005, a unique number is read. Specifically, a testing apparatus (not shown) that conducts a test on memory chips 100 reads from the database DB a unique number corresponding to a memory chip 100 on which a wafer test is carried out.

[S1006]

Figure 9:
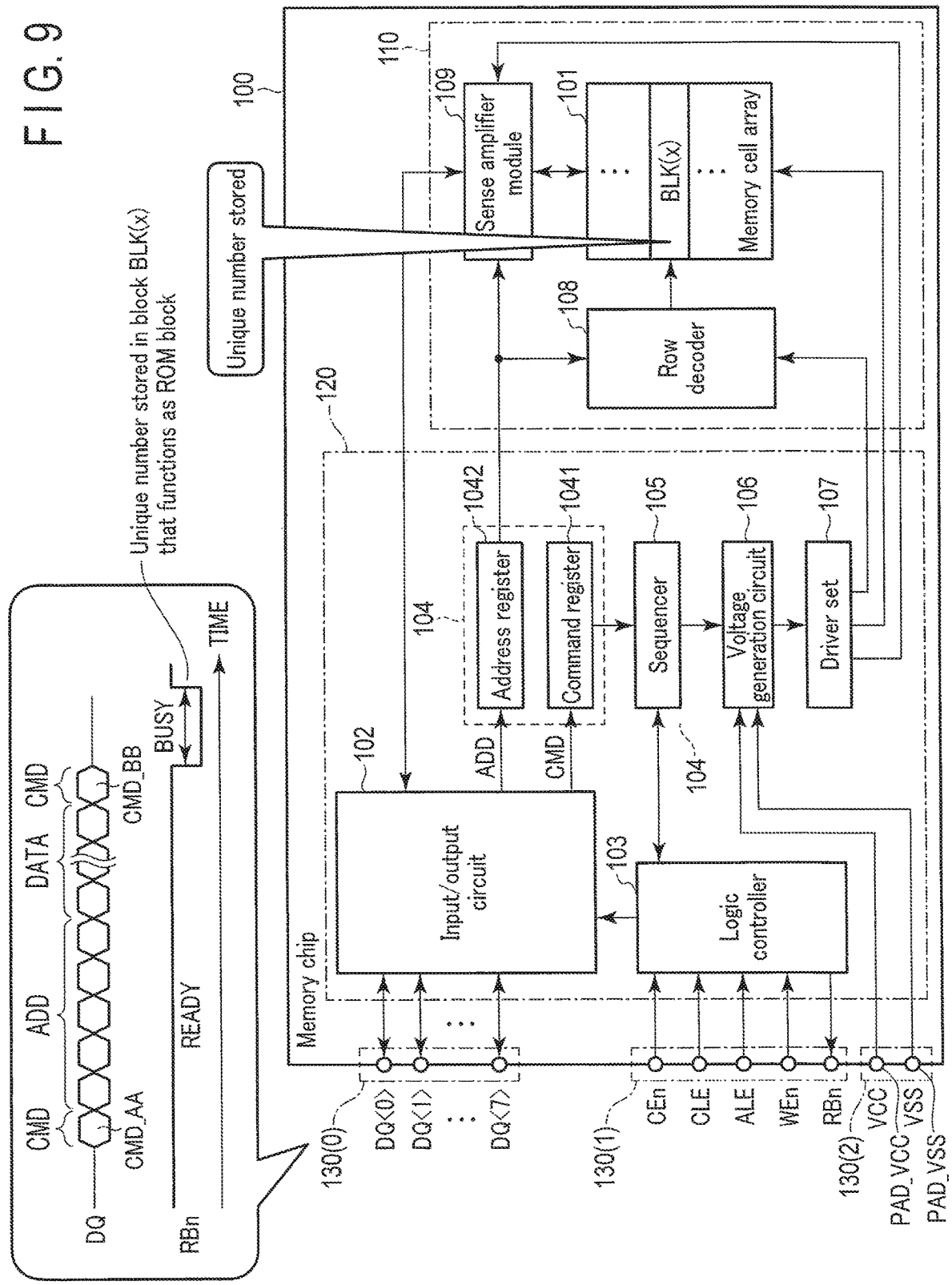
FIG. 9 is a diagram showing a command sequence slated to be input to a memory chip.

Step S1006 is explained with reference to FIG. 9. FIG. 9 is a diagram showing a memory chip 100 and a command sequence slated to be input to the memory chip 100.

In step S1006, a unique number is written in a memory chip 100. Specifically, the testing apparatus (not shown) issues a command sequence for writing a unique number assigned to a memory chip 100 in step S1002 to the memory chip 100. The command sequence includes a command (CMD), an address (ADD), and data (DATA), etc., for example. The command sequence is supplied to the memory chip 100 as a signal DQ<7:0>.

As shown in FIG. 9, in the case of step S1006, the memory chip 100 receives a command sequence for writing the unique number as a signal DQ<7:0> from the testing apparatus. As an example of the command sequence, the memory chip 100 receives a command CMD_AA, and subsequently receives multiple cycles (for example 5 cycles) of an address. Then, the memory chip 100 receives data (DATA) and a command CMD_BB. The command CMD_AA in the command sequence for writing a unique number means a writing of a unique number. The address (ADD) in the command sequence for writing a unique number indicates an address for writing a unique number. The data (DATA) in the command sequence for writing a unique number indicates a unique number. The command CMD_BB in the command sequence for writing a unique number instructs writing of a unique number. The foregoing example of the command sequence for writing a unique number is merely an example and can be modified in various manners.

When the input/output circuit 102 receives the command sequence for writing a number, the signal RBn is changed from a "ready" state to a "busy" state via the logic controller 103.

The memory chip 100 writes the unique number to the memory cell array 101 during the time when the signal RBn is in a "busy" state. Specifically, in the memory cell array 101, there is a block BLK(x) (x is a discretionarily determined integer number) that functions as a ROM fuse region for storing setting information, etc. for the memory chip 100. The address (ADD) included in the command sequence for writing a unique number is an address that designates a memory cell transistor MT in a block BLK(x) for storing a unique number. The sequencer 105 stores a unique number stored in the block BLK(x) based on the address (ADD) included in the command sequence for writing a unique number.

Step S1005 and step S1006 may be incorporated into step S1004.

[S1007]

In step S1007, dicing is performed on the wafer 200. Specifically, the wafer 200 is stationarily fixed and each memory chip 100 is physically cut out by a blade.

[S1008]

In step S1008, bonding is performed on the memory chips 100. Specifically, an apparatus for manufacturing memory chips 100 (not shown) picks up the memory chips 100 diced in step S1007. The memory chips 100 are then stacked in such a manner that pads are exposed as shown in FIG. 3. Then, a bonding wire is coupled to the exposed pads of each memory chip 100. Thereby, the memory chips 100 are coupled.

[S1009]

In step S1009, packaging is performed. Specifically, the memory chip manufacturing apparatus (not shown) seals the memory chips 100 bonded in step S1008 with a resin. A package 11 is thereby produced. A package 11 is then packaged in the memory system 1.

[S1010]

In step S1010, a final test is performed. Specifically, a testing apparatus (not shown) performs an operation check on the memory system 1. At this time, an outer appearance examination for the memory system 1 or a solder ball examination, etc. may be performed.

[S1011]

Figure 10:
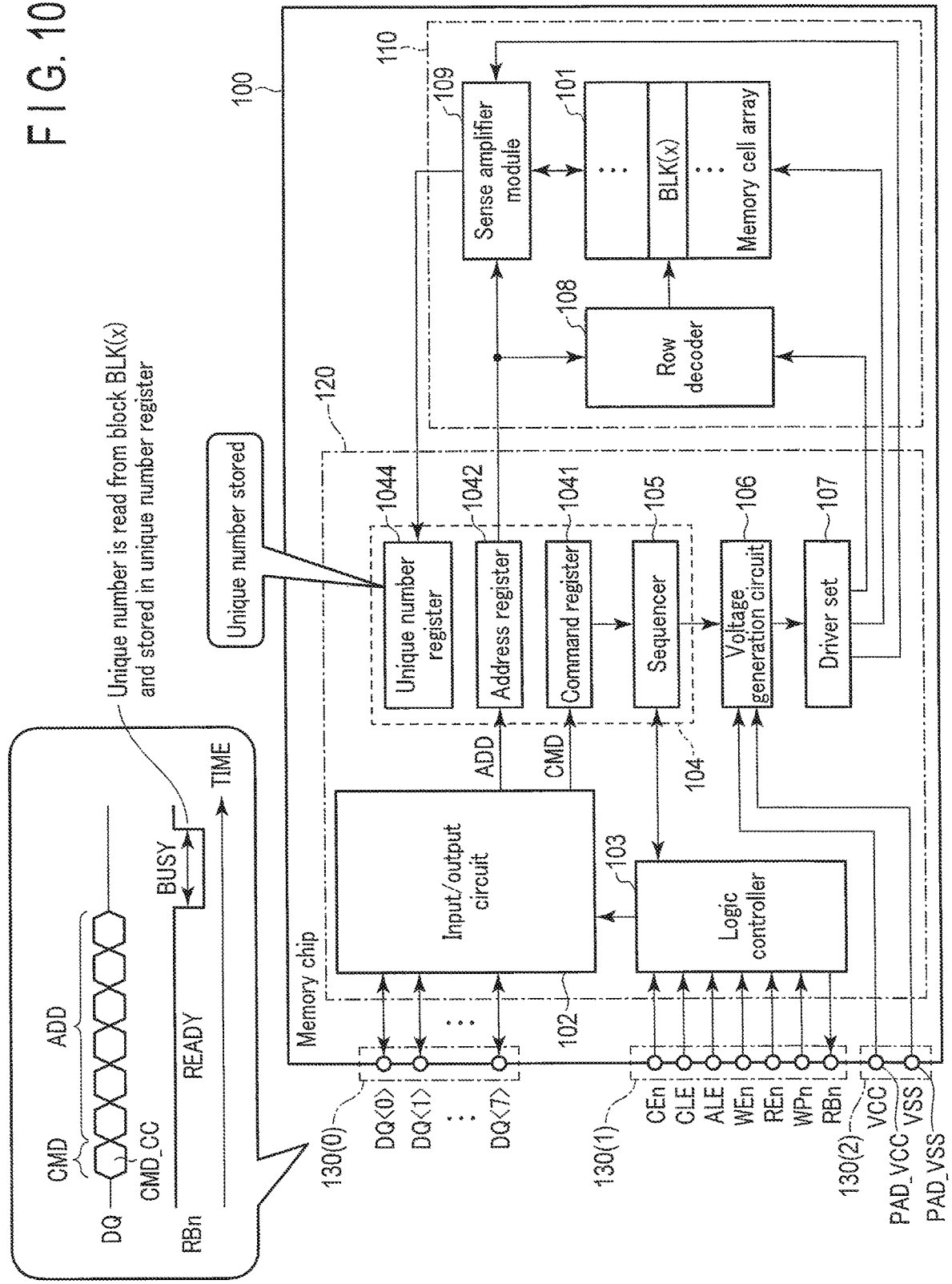
FIG. 10 is a diagram showing a command sequence slated to be input to a memory chip.

Step S1011 is explained with reference to FIG. 10. FIG. 10 is a diagram showing a memory chip 100 and a command sequence slated to be input to the memory chip 100.

In step S1011, a unique number is read and output to the unique number register 1044 in the memory chip 100. Specifically, a testing apparatus (not shown) issues to the memory chip 100 a command sequence for reading and outputting a unique number stored in a block BLK(x) of a memory cell array 101 in step S1006 to the unique number register 1044.

As shown in FIG. 10, in the case of step S1011, the memory chip 100 receives a command sequence for reading a unique number as a signal DQ<7:0> from the testing apparatus. As an example of the command sequence, the memory chip 100 receives a command CMD_CC, and subsequently receives multiple cycles (for example 5 cycles) of an address. The command CMD_CC of a command sequence for reading a unique number means reading a unique number. The address (ADD) of the command sequence for reading a unique number indicates an address of the memory cell transistor MT that stores the unique number. The foregoing example of the command sequence for reading a unique number is merely an example and can be modified in various manners.

When the input/output circuit 102 receives the command sequence for reading a unique number, the signal RBn is changed from a "ready" state to a "busy" state via the logic controller 103.

The memory chip 100 reads the unique number from the memory cell array 101 during the time when the signal RBn is in a "busy" state. Specifically, the sequencer 105 stores the unique number from the block BLK(x) based on the address (ADD) included in the command sequence for reading a unique number. The read unique number is stored in the unique number register 1044.

[S1012]

In step S1012, a unique number is read. Specifically, a testing apparatus (not shown) that conducts a test of memory chips 100 reads from the database DB a unique number corresponding to a memory chip 100 for which a wafer test is conducted.

Figure 11:
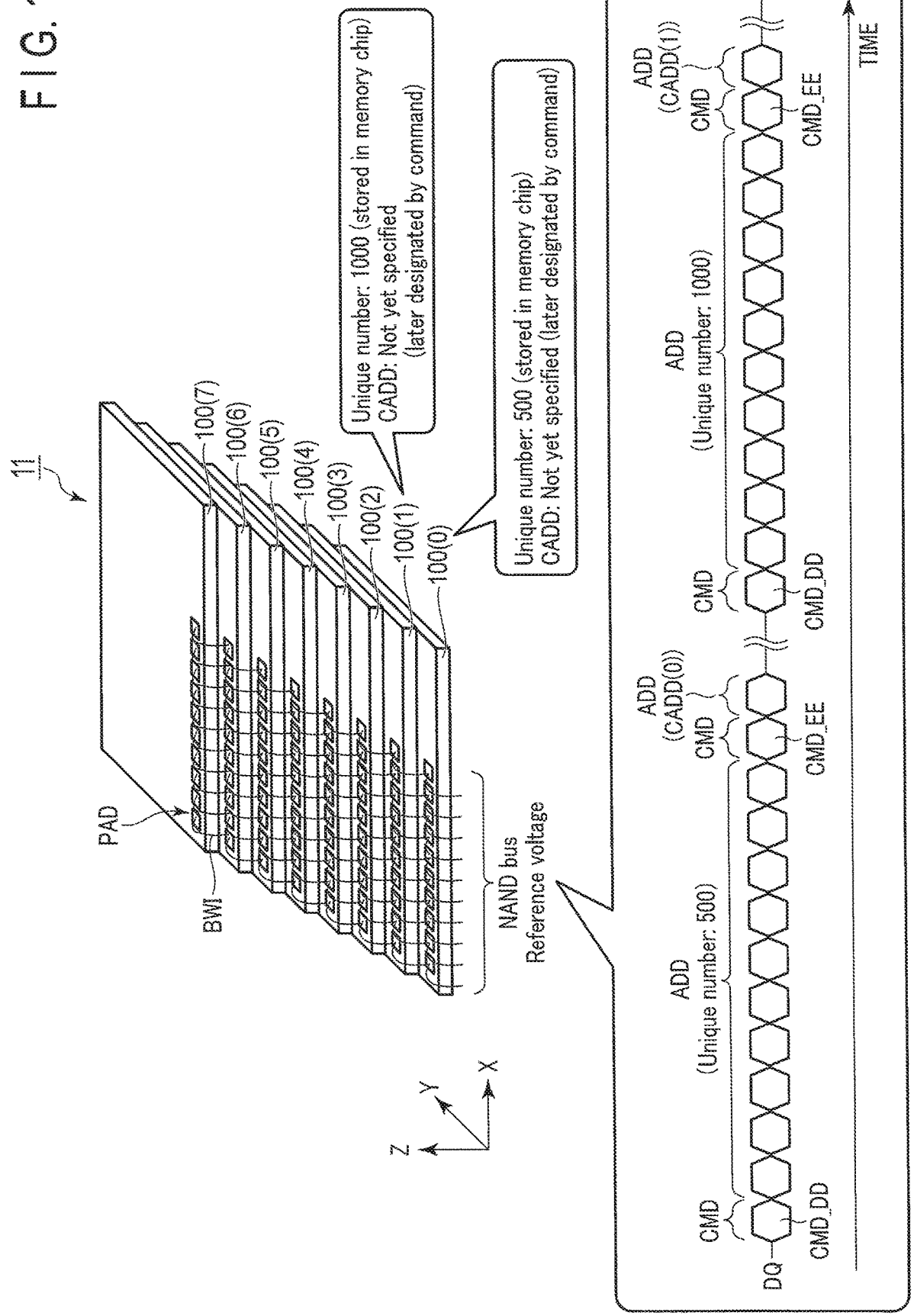
FIG. 11 is a diagram showing a package and a command sequence slated to be input to a package.

Step S1013 is explained with reference to FIG. 11. FIG. 11 is a diagram showing a package 11 and a command sequence slated to be input to the package 11.

In step S1013, a command that designates an address is issued to the package 11 based on the unique number. Specifically, the testing apparatus (not shown) issues a command sequence for writing to the memory chip 100 a chip address CADD determined based on the unique number assigned to the memory chip 100 in step S1002.

As shown in FIG. 11, the testing apparatus (not shown) issues a command that designates an address based on the unique number to the package 11.

As shown in FIG. 11, the pads having the same function in the plurality of memory chips 100 included in the package 11 are coupled in common. For this reason, the same command sequence is input to the memory chips 100 included in the package 11 at approximately the same timing. In the case of FIG. 11, the command sequence for writing a chip address is input to each memory chip 100.

As shown in FIG. 11, as an example of the command sequence, each memory chip 100 receives a command CMD_DD, and subsequently receives multiple cycles (for example 10 cycles) of an address. Each memory chip 100 receives the command CMD_EE and receives an address (for example, one cycle). The command CMD_DD in the command sequence for writing a chip address means a writing of a chip address. The address (ADD) subsequent to the command CMD_DD indicates a unique number. The command CMD_EE in the command sequence for writing a chip address indicates that the subsequent address is a chip address. The address (ADD) after the command CMD_EE indicates a chip address.

Thus, one set of command sequences is a command sequence for a single memory chip 100. In other words, in step S1013, the testing apparatus issues multiple sets of command sequences according to the number of memory chips 100 included in the package 11. In the example of FIG. 11, eight memory chips 100 are included in the package 11; thus, the testing apparatus issues eight sets of command sequences.

As an example, a case where the memory chip 100(0) has the unique number of 500 and the memory chip 100(1) has the unique number of 1000 is described.

Until the command sequence for writing a chip address is received, the memory chips 100(0) and 100(1) do not store chip addresses. However, as shown in FIG. 11, if the unique number is 500, a command sequence containing CADD0 as a chip address is received from the testing apparatus, and if the unique number is 1000, a command sequence containing CADD1 as a chip address is received.

[S1014]

Figure 12:
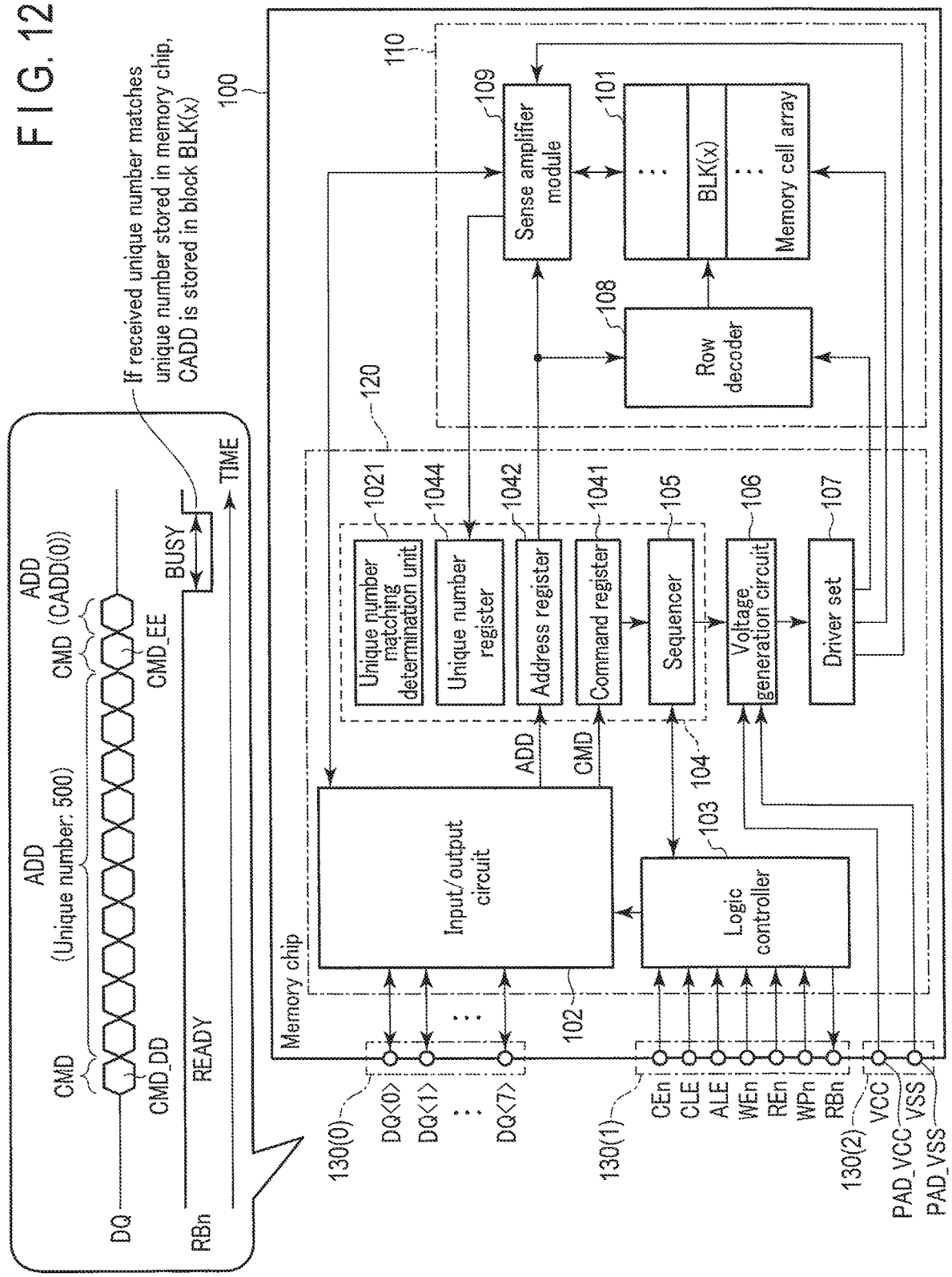
FIG. 12 is a diagram showing a command sequence slated to be input to a memory chip.

Step S1014 is explained with reference to FIG. 12. FIG. 12 is a diagram showing a memory chip 100 and a command sequence slated to be input to the memory chip 100.

In step S1014, a chip address is written in a memory chip 100. Specifically, the memory chip 100 determines whether or not unique numbers match when receiving the command sequence issued in step S1013.

Furthermore, the unique number matching determination unit 1021 acquires a unique number from the unique number register 1044 and determines whether the unique number matches or does not match the number included in the command sequence. The unique number is acquired from the unique number register 1044, and if it matches the unique number included in the command sequence, the signal RBn status is changed to a "busy". The unique number matching determination unit 1021 notifies the sequencer 105 of the matching, and stores the chip address included in the same command address as the matching address in a place where the chip address CADD of a block BLK(x) that functions as a ROM fuse is stored.

A unique number is acquired from the unique number register 1044, and if it does not match the unique number included in the command sequence, the chip address included in the same command sequence as the non-matching sequence is ignored.

Step S1011 to step S1014 may be incorporated into step S1010.

[S1015]

In step S1015, the memory system 1 is shipped to a client, for example.

[S1016]

Figure 13:
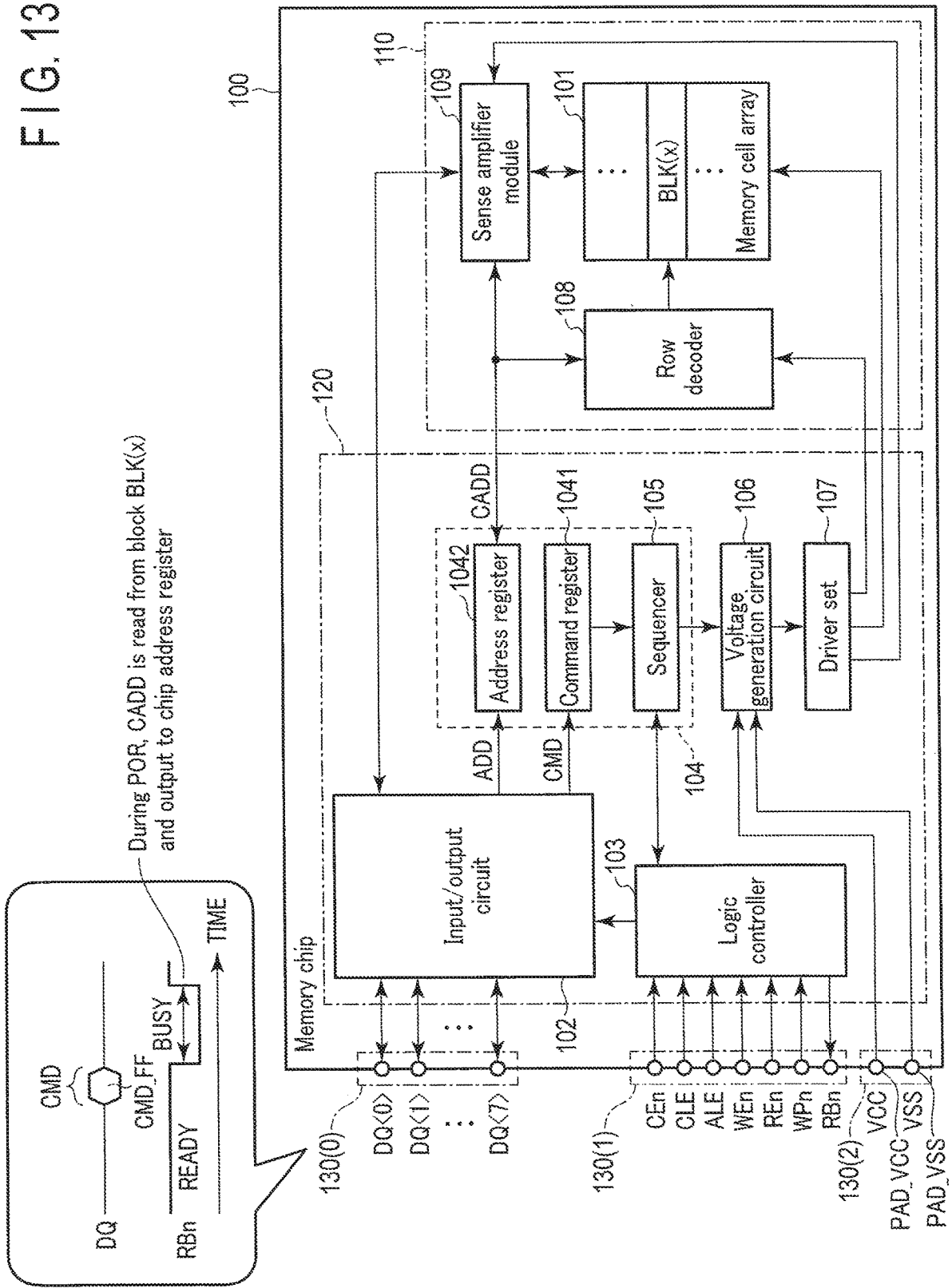
FIG. 13 is a diagram showing a command sequence slated to be input to a memory chip.

Step S1016 is explained with reference to FIG. 13. FIG. 13 is a diagram showing a memory chip 100 and a command sequence slated to be input to the memory chip 100.

In step S1016, a power-on-read (or power-on-reset) (POR) operation is performed. For example, the controller 20 issues a command CMD_FF when the memory chip 100 is activated (turned on) so that the memory chip 100 performs a POR operation. A POR operation is for reading parameter settings of various operations from a block BLK (x) functioning as a ROM fuse.

Specifically, upon receipt of the command CMD_FF when the memory chip 100 is activated, the sequencer 105 changes the signal RBn to a "busy" state. The sequencer 105 is then read parameter settings of various operations from the block BLK(x). Specifically, as a POR operation, a chip address is read from a block BLK(x) and is stored in the address register 104.

[S1017]

Figure 14:
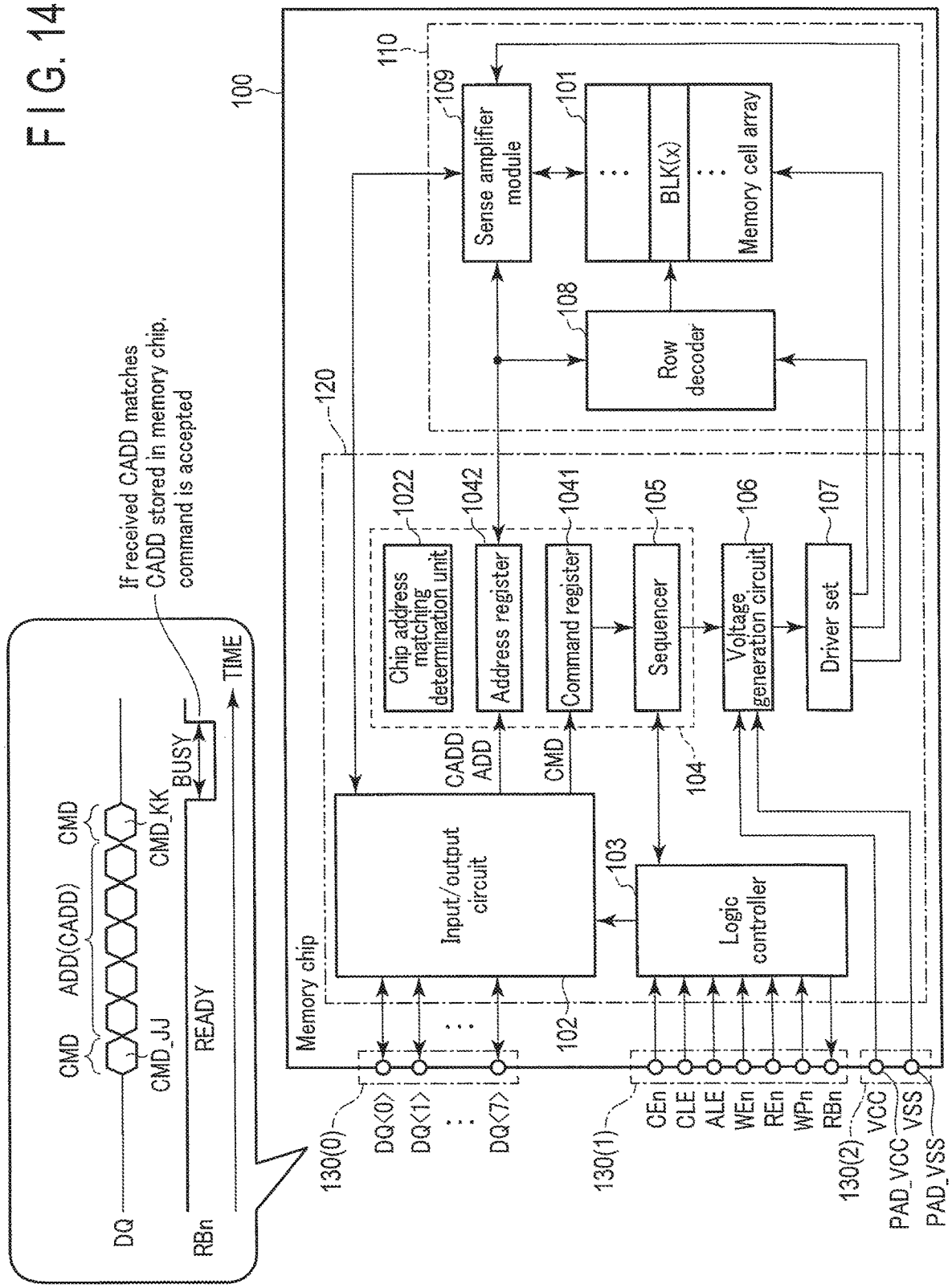
FIG. 14 is a diagram showing a command sequence slated to be input to a memory chip.

Step S1017 is explained with reference to FIG. 14. FIG. 14 is a diagram showing a memory chip 100 and a command sequence slated to be input to the memory chip 100.

In step S1017, a normal operation by a user of the package 11 (for example, a read operation) is performed. Specifically, the controller 20 issues a command sequence relating to a read operation to the package 11.

As shown in FIG. 14, in the case of step S1006, the memory chip 100 receives a command sequence for reading data as a signal DQ<7:0> from the testing apparatus. As an example of the command sequence, the memory chip 100 receives a command CMD_JJ, and subsequently receives multiple cycles (for example 5 cycles) of an address. Then, the memory chip 100 receives a command CMD_KK.

The command CMD_JJ in the command sequence for reading a unique number means that an operation is a reading operation. The address subsequent to the command CMD_JJ is an address that designates a place from which data is read and a chip address CADD. The command CMD_KK is a command for performing a read operation.

Upon receipt of a chip address CADD, the chip address matching determination unit 1022 determines whether or not the received chip address CADD matches the chip address CADD stored in the address register 1042.

If the chip addresses CADD match, the chip address matching determination unit 1022 performs the command sequence containing the chip address CADD.

If the chip addresses CADD do not match, the chip address matching determination unit 1022 does not perform the command sequence containing the chip address CADD.

<1-3> Effects

According to the foregoing embodiment, a unique number is stored in a memory chip 100 before the memory chip 100 is mounted into a package 11. With the unique number, the memory chip 100 can be specified. Furthermore, in the package 11 in which the memory chips 100 are coupled in common, the chip address CADD is stored in the memory chip 100 based on the unique number.

It is thus possible to designate a memory chip 100 individually using a chip address CADD even when a package 11 has multiple memory chips 100 coupled in common.

Advantageous effects of the present embodiment are described hereinafter.

To explain the advantageous effects of the present embodiment, a configuration example of a package 11 according to a comparative example is described hereinafter, with reference to FIG. 15. FIG. 15 is a diagram showing an example of a configuration of a package 11 according to a comparative example. For easy understanding, only two packages 11(0) and 11(1) are described in FIG. 15.

As shown in FIG. 15, each of the packages 11(0) and 11(1) has eight memory chips 100. Chip addresses CADD (0) to CADD(7) are assigned to eight memory chips 100 included in the package 11(0). Similarly, chip addresses CADD(0) to CADD(7) are assigned to eight memory chips 100 included in the package 11(1). Thus, in the comparative example, the same chip addresses CADD are assigned to the memory chips 100 included in the package 11(0) and the memory chips 100 included in the package 11(1). However, different signals CEn are input to two packages 11(0) and 11(1), respectively. Specifically, the signal CEn(0) is input to the package 11(0), and the signal CEn(1) is input to the package 11(1). For this reason, when the chip address CADD(0) is selected, for example, if the signal CEn(0) or CEn(1) is selected, the memory chip 100(0) corresponding to the chip address CADD(0) contained in either the package 11(0) or 11(1) can be selected. In the comparative example, however, it is necessary to prepare a different signal CEn for each package 11. In this case, the number of signal lines corresponding to the number of packages 11 may increase.

In the present embodiment, on the other hand, it is possible to freely assign a chip address CADD, regardless of a package 11.

Herein, a configuration example of the package 11 according to the present embodiment is explained with reference to FIG. 16. FIG. 16 is a diagram showing an example of a configuration of the package 11 according to the present embodiment. For easy understanding, two packages 11(0) and 11(1) are described in FIG. 16.

As shown in FIG. 16, each of the packages 11(0) and 11(1) has eight memory chips 100. Chip addresses CADD (0) to CADD(7) are assigned to eight memory chips 100 included in the package 11(0). Chip addresses CADD(8) to CADD(15) are assigned to eight memory chips 100 included in the package 11(1). Thus, in the present embodiment, it is possible to freely assign a chip address CADD, regardless of a package 11.

Since different chip addresses CADD are assigned to the memory chips 100 included in two packages 11(0) and 11(1), it is possible to share the signal CEn between these packages 11(0) and 11(1), unlike the comparative example. As a result, it is possible to suppress the increase in the number of signal lines relating to the signal CEn.

Other advantageous effects of the present embodiment are further described.

As described above, a plurality of memory chips 100 are included in a package 11. In the plurality of memory chips 100, the pads that receive (or transmit and receive) the same signal or voltage are electrically coupled in common by a bonding wire. For this reason, it is necessary to distinguish the memory chips 100 included in the package 11. Unless the memory chips are distinguished from each other, when a package 11 receives a command set, all memory chips 100 included in the package 11 would perform the same operation. As a result, the case would be the same as a case where only a single memory chip 100 is included in the package 11, despite the fact that multiple memory chips 100 are included in the package 11. For this reason, it is at least necessary to assign a chip address CADD to each memory chip 100.

Figure 17:
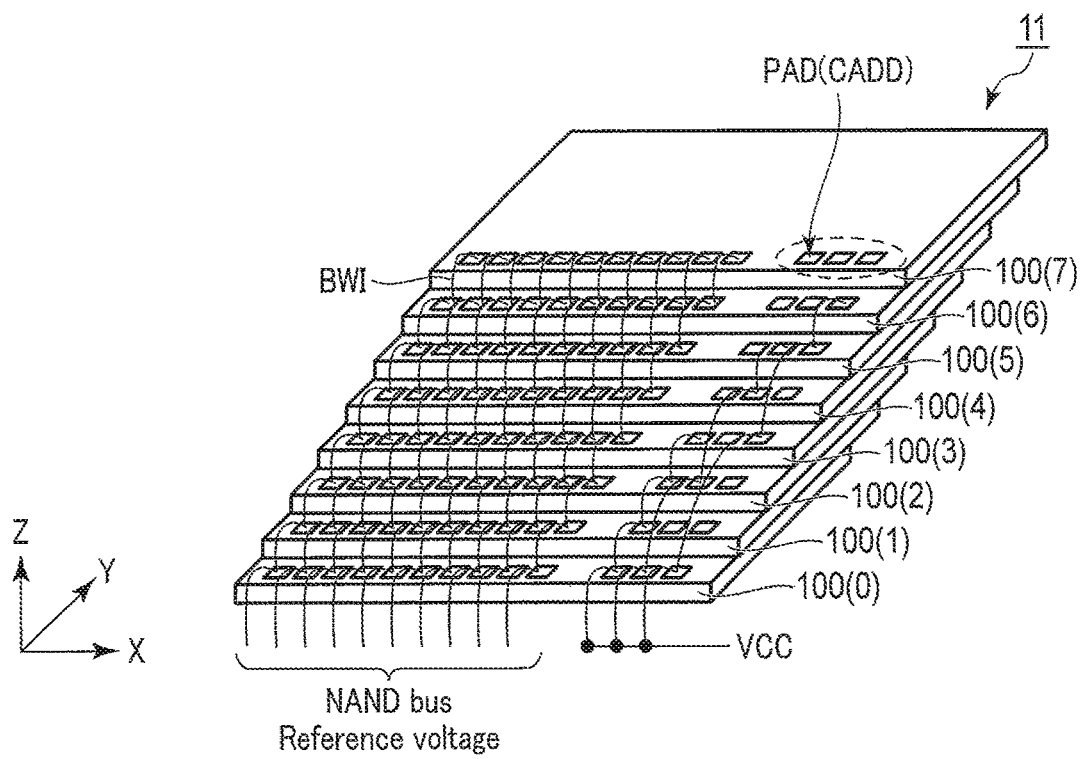
FIG. 17 is a block diagram showing an example of the relationship between memory chips included in a package according to the comparative example.

Using FIG. 17, the relationship between the memory chips 100 included in the package 11 according to the comparative example is described. FIG. 17 is a block diagram showing an example of the relationship between the memory chips 100 included in the package 11 according to the comparative example. As shown in FIG. 17, multiple pads (CADD) for a chip address CADD may be provided in each memory chip 100, for example. Specifically, multiple pads (CADD) for a chip address CADD are provided at the edge of a memory chip 100, similarly to the other pads. As shown in FIG. 17, there are three pads (CADD) for a chip address CADD, for example. 3-bit information can be produced by changing between an input and a non-output of a voltage VCC to the three pads (CADD). In the comparative example, this three-bit information is a chip address CADD. This can be realized by changing the connection of bonding wires relating to a voltage VCC for each memory chip 100.

In this case, however, an area in which the pads (CADD) for a chip address CADD are slated to be provided is necessary. This may lead to an increase in an area size of the memory chip 100.

In the forgoing embodiment, however, such pads (CADD) for a chip address CADD are negated, and therefore it is possible to suppress an increase in an area size of the memory chip 100.

As shown in FIG. 17, it is also possible to apply the present embodiment to the memory chip 100 in which multiple pads (CADD) for a chip address CADD) are provided.

Figure 18:
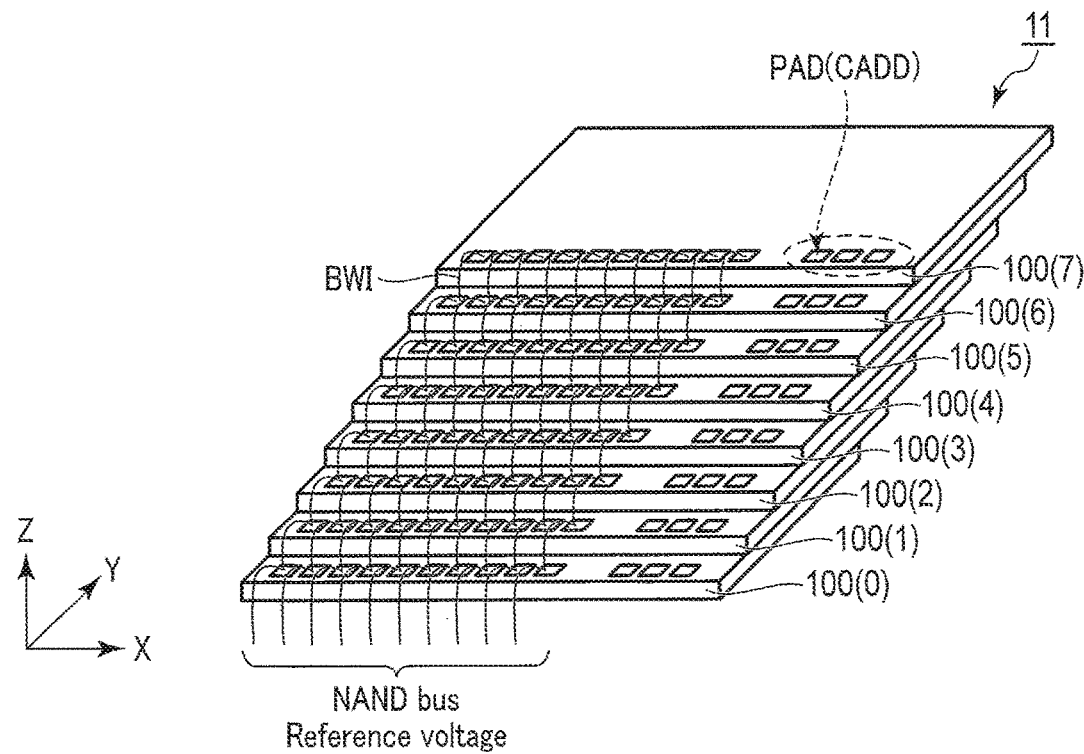
FIG. 18 is a block diagram showing an example of the relationship between memory chips included in a package according to the comparative example.

As shown in FIG. 18, the present embodiment is also applicable to a case where no bonding wire is connected to the pads (CADD) for a chip address.

There is a possibility that products like those shown in FIGS. 17 and 18 may be produced during a process of integrating the technology according to the present embodiment to memory chips 100. The foregoing embodiment is applicable even to such a case.

<2> Second Embodiment

Next, the second embodiment is described. In the second embodiment, a case where a controller specifies a unique number and assigns a chip address is explained.

Descriptions of portions similar to those of the first embodiment are omitted. The second embodiment can be combined with the first embodiment.

<2-1> Configuration of Controller

The controller 20 of the memory system 1 according to the second embodiment is explained with reference to FIG. 19. FIG. 19 is a block diagram showing the configuration example of the memory system according to the second embodiment. The memory controller 20 includes, for example, a host interface circuit 21, a central processing unit (CPU) 22, a random access memory (RAM) 23, a buffer memory 24, an error correction code (ECC) circuit 25, a NAND interface circuit 26, and a chip address assignment circuit 27.

The chip address assignment circuit 27 has a chip address determination circuit 271. The chip address determination circuit 271 determines a chip address CADD to be assigned to the memory chip 100. The chip address CADD is thereby supplied to the memory chip 100.

<2-2> Manufacturing Method and Using Method

The foregoing first embodiment is applicable to a case where the testing apparatus knows which unique number is assigned to which memory chip 100. However, in the actual manufacture of memory systems 1, a manufacturer manages a large number of memory chips 100. For this reason, it may be difficult to determine which memory chip 100 stores which unique number. In such a case, if the following method is adopted, it would be possible to adequately determine a unique number of a memory chip 100.

A method of manufacturing the memory system 1 and a method of using the memory system 1 are described, with reference to the flowchart shown in FIG. 20.

FIG. 20 is a flowchart illustrating a method of manufacturing the memory system 1 and a method of using the memory system 1.

[S2001]

Step S2001 is the same as steps S1001 to S1011 described in the first embodiment.

[S2012]-[S2014]

Steps S2012 to S2014 describe an operation in which it is assumed that the manufacturer of the memory system 1 has not yet assigned a unique number to a memory chip 100 at the time of step S2012.

Figure 21:
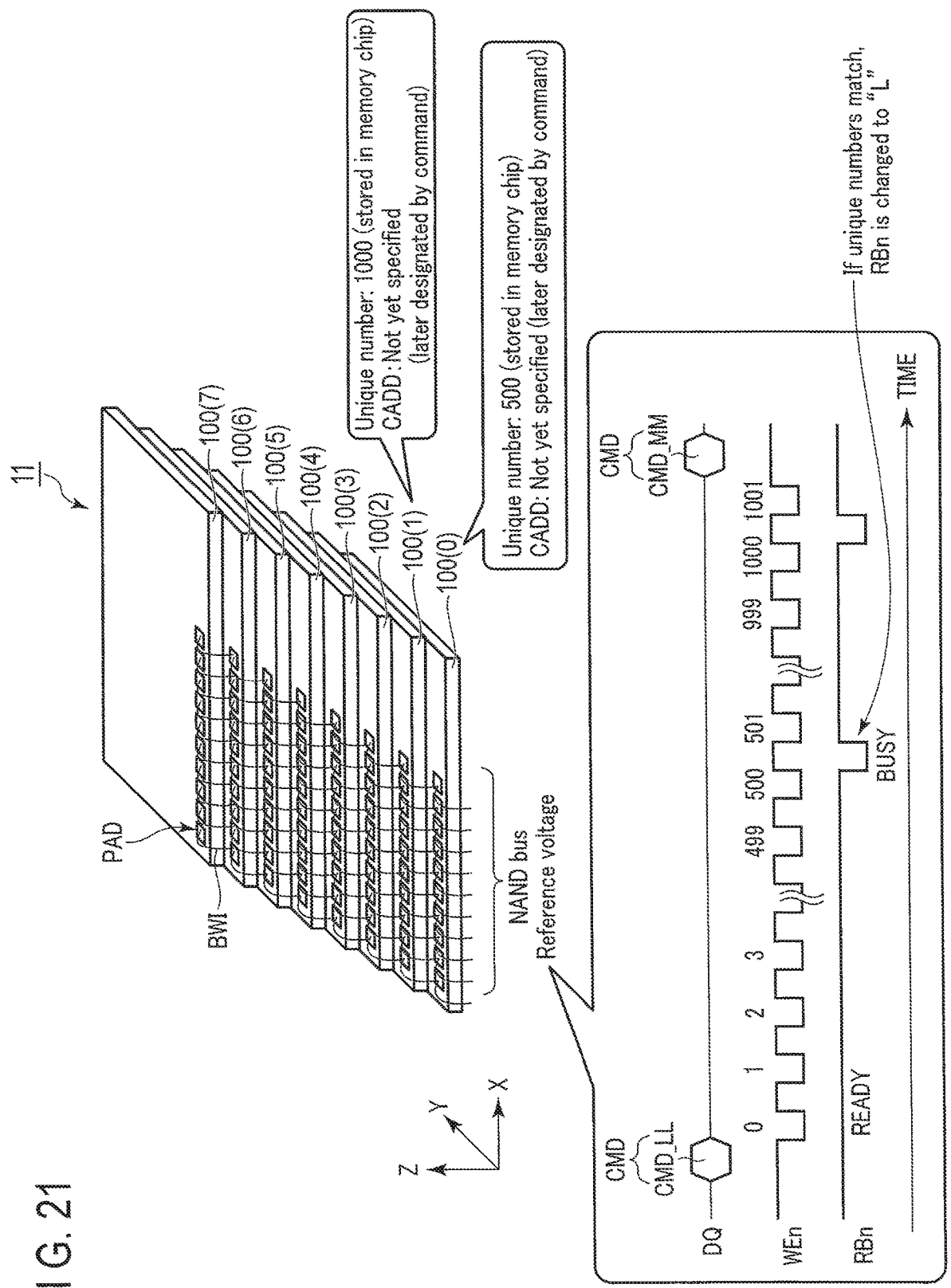
FIG. 21 is a diagram showing a package and a command sequence slated to be input to a package, and a signal WEn.
Figure 22:
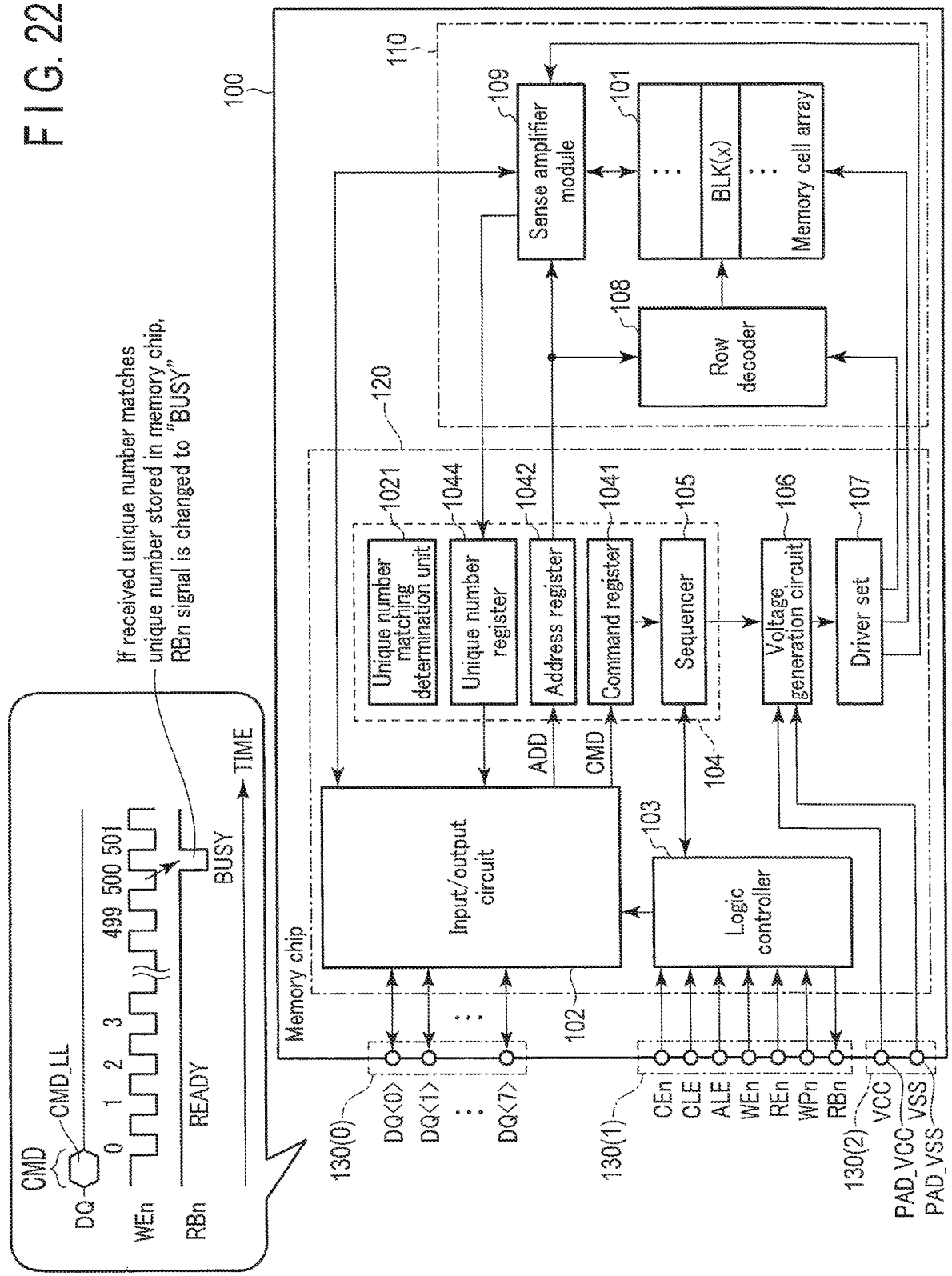
FIG. 22 is a diagram showing a command sequence slated to be input to a memory chip.

Steps S2012 through S2014 are explained with reference to FIGS. 21 and 22. FIG. 21 is a diagram showing the package 11 and a command sequence slated to be input to the package 11, and a signal WEn. FIG. 22 is a diagram showing a memory chip 100 and a command sequence slated to be input to the memory chip 100.

In step S2012, a command for determining a unique number of each memory chip 100 is issued. Specifically, the controller 20 issues to the package 11 a command sequence for determining a unique number assigned to a memory chip 100 in step S1002.

As shown in FIG. 21, as an example of such a command sequence, the chip address determination circuit 271 transmits a command CMD_LL to each memory chip 100, and subsequently toggles a specific signal (e.g., signal WEn) a plurality of times (e.g., 1002 times). After toggling the specific signal the predetermined number of times, the chip address determination circuit 271 transmits a command CMD_MM to each memory chip 100.

The command CMD_LL in the command sequence for determining a unique number means starting of a unique number search. The number of times of toggling the certain signal (for example, signal WEn) indicates a unique number. The command CMD_MM in the command sequence for determining a unique number indicates finishing of a unique number search.

In step S2013, the memory chip 100 determines whether or not its own unique number matches the unique number contained in the command sequence. If it is determined that the memory chip 100 determines that its own unique number matches the unique number in the command sequence (Yes in step S2013), the memory chip 100 changes the signal RBn from a "ready" state to a "busy" state (step S2014). The chip address determination circuit 271 can thereby know the unique numbers of the memory chips 100.

In the example of FIG. 21, suppose the memory chip 100(0) stores the unique number 500 and the memory chip 100(1) stores the unique number 1000. In this case, when the signal WEn toggles 500 times, the memory chip 100(0) changes the signal RBn from a "ready" state to a "busy" state. In this case, when the signal WEn toggles 1000 times, the memory chip 100(1) changes the signal RBn from a "ready" state to a "busy" state. It is thereby possible for the chip address determination circuit 271 to know that there are memory chip 100 assigned the unique number 500 and the memory chip 100 assigned the unique number 1000 in the package 11. The wiring of the signal RBn is shared between the memory chip 100(0) and the memory chip 100(1). For this reason, the chip address determination circuit 271 does not know which memory chip 100 is assigned the unique number 500 and which memory chip 100 is assigned the unique number 1000.

A description is provided while focusing on a single memory chip 100, with reference to FIG. 22. FIG. 22 shows a memory chip 100(0) of FIG. 21.

As shown in FIG. 22, upon receipt of the command sequence in step S2012, the memory chip 100 counts the number of times of toggling the signal WEn, with, for example, the unique number matching determination unit 1021. Then, it is determined whether or not the number of times of toggling the signal WEn matches the unique number stored in the unique number register 1044. Then, if it is determined that the number of times of toggling the signal WEn matches the unique number stored in the unique number register 1044, the unique number matching determination unit 1021 changes the signal RBn from a "ready" state to a "busy" state using the logic controller 103.
[S2015]

If the signal RBn is changed to a "busy" state, the chip address determination circuit 271 stores the unique number based on the timing when the signal RBn changed to a "busy" state and the number of times of toggling the signal WEn. After step S2014, a chip address CADD is assigned to each unique number. Any method can be adopted to assign a chip address CADD. For example, a chip address CADD may be assigned in the ascending order of unique numbers.
[S2016]

Step S2016 is the same as steps S1013 to S1017 described in the first embodiment.
<2-3> Effects According to the foregoing embodiment, a unique number can be appropriately read from a package that includes a plurality of memory chips which are coupled to each other in common.

In the manufacturing method of a memory system 1, the memory chips 100 are not cut out from the wafer 200 when the unique numbers are written to the memory chips 100 (S1006). For this reason, it is possible to know a unique number of a memory chip 100. If, however, the memory chips 100 are cut out from the wafer 200 and mounted into the package 11, it would be difficult to know which memory chip 100 has which unique number. Accordingly, a unique number of a memory chip 100 can be determined as appropriate by applying the foregoing embodiment.

When simply a unique number is read from the package 11, the unique numbers of all memory chips 100 included in the package 11 are read, and the signals from all memory chips 100 collide in the signal DO, and the unique numbers cannot be appropriately read for this reason.

However, by adopting the foregoing embodiment, the unique numbers can be determined as appropriate.

<3> Third Embodiment

Next, a third embodiment is described. In the third embodiment, a case where a controller specifies a unique number using a dichotomy method and assigns a chip address is explained. Descriptions of portions similar to those of the first embodiment are omitted. The third embodiment may be combined with the first and second embodiments.
<3-1> Configuration of Controller The controller 20 of the memory system 1 according to the third embodiment is explained with reference to FIG. 23. FIG. 23 is a block diagram showing the configuration example of the memory system according to a third embodiment.

The chip address assignment circuit 27 has a chip address determination circuit 271 and a dichotomy circuit 272. The dichotomy circuit 272 is a circuit for determining a unique number of a memory chip 100.
<3-2> Manufacturing Method and Using Method In the foregoing second embodiment, it is necessary to toggle a specific signal the number of times corresponding to a largest unique number. For example, if the largest unique number is 100,000, it is necessary to toggle a specific signal 100,000 times. The larger a unique number is, the longer the time required for determining a unique number may become.

However, with the present embodiment, it is possible to shorten a time required for determining a unique number.

Figure 24:
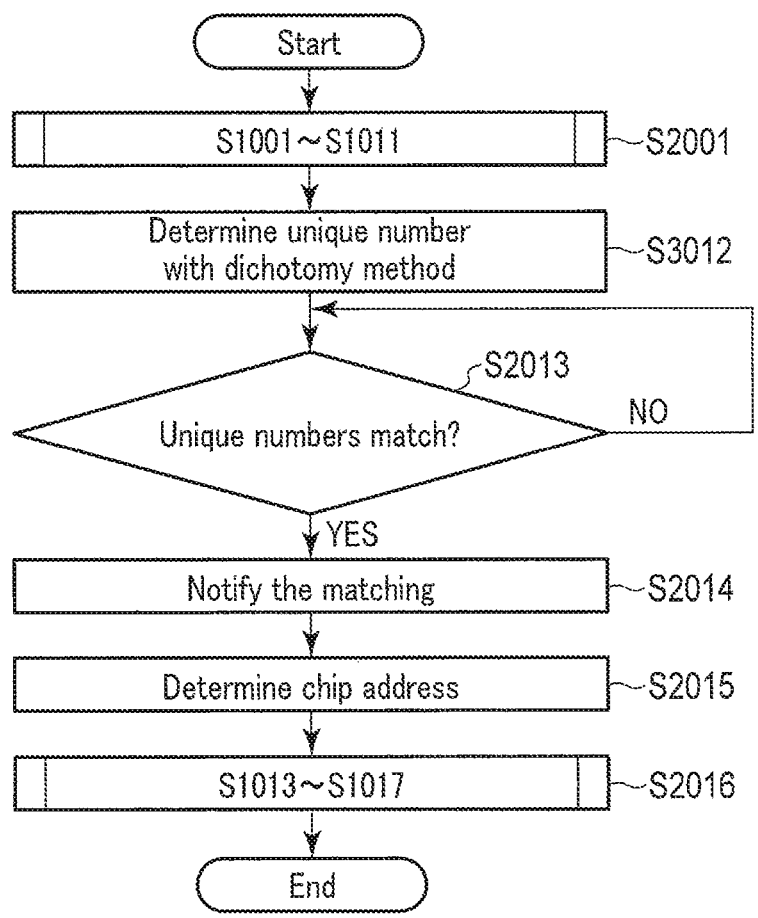
FIG. 24 is a flowchart illustrating a method of manufacturing a memory system and a method of using a memory system.

A method of manufacturing the memory system 1 and a method of using the memory system 1 are described, with reference to the flowchart shown in FIG. 24.

FIG. 24 is a flowchart illustrating a method of manufacturing the memory system 1 and a method of using the memory system 1.
[S2001]

Step S2001 is the same as steps S1001 to S1011 described in the first embodiment.
[S3012]

The dichotomy circuit 272 determines a unique number of a memory chip 100 using a dichotomy method. Specifically, the dichotomy circuit 272 calculates a first intermediate value of a minimum and a maximum value of a unique number, and distinguishes a memory chip 100 assigned a unique number smaller than the first intermediate value from a memory chip 100 assigned a unique number larger than the first intermediate value. Furthermore, the dichotomy circuit 272 calculates a second intermediate value of a minimum unique number and a first intermediate value, and distinguishes a memory chip 100 assigned a unique number smaller than the second intermediate value from a memory chip 100 assigned a unique number larger than the second intermediate value. It is thus possible to determine a unique number of each memory chip 100 using a dichotomy method in numerical value analysis.

Each intermediate value used in a dichotomy method may be indicated in data contained in a command sequence. If the unique numbers match, each memory chip 100 may be indicated by the signal RBn similarly to the second embodiment.

The dichotomy circuit 272 thus determines a unique number of a memory chip 100.

[S2013] to [S2016]

Steps S2013 to S2016 are the same as those described in the second embodiment.

<3-3> Effects

According to the foregoing embodiment, it is possible to determine a unique number of a memory chip 100 more rapidly than in the second embodiment.

<4> Fourth Embodiment

Next, the fourth embodiment is described. In the fourth embodiment, an example where a memory chip 100 has a delay circuit is described. Descriptions of portions similar to those of the foregoing embodiments are omitted. The fourth embodiment can be combined with the first to third embodiments.

<4-1> Configuration of Memory Chip

Next, a configuration example of the memory chip 100 according to the fourth embodiment is described with reference to FIG. 25. FIG. 25 is a block diagram showing the configuration example of the memory chip 100 according to the fourth embodiment.

As shown in FIG. 25, the peripheral circuit 120 includes an input/output circuit 102, a logic controller 103, a register 104, a sequencer 105, a voltage generation circuit 106, a driver set 107, and a delay circuit 140.

The delay circuit 140 is a circuit that delays a timing of executing a command in accordance with a chip address CADD.

<4-2> Operation

Figure 26:
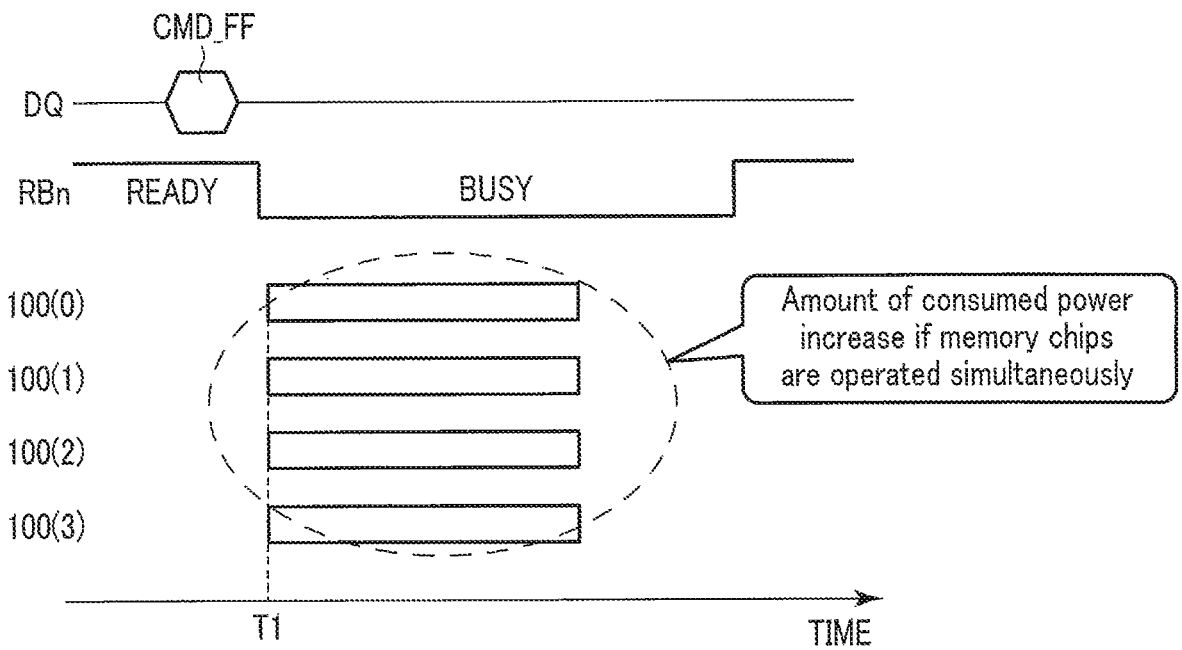
FIG. 26 is a diagram showing an operation (POR) according to a comparative example.
Figure 27:
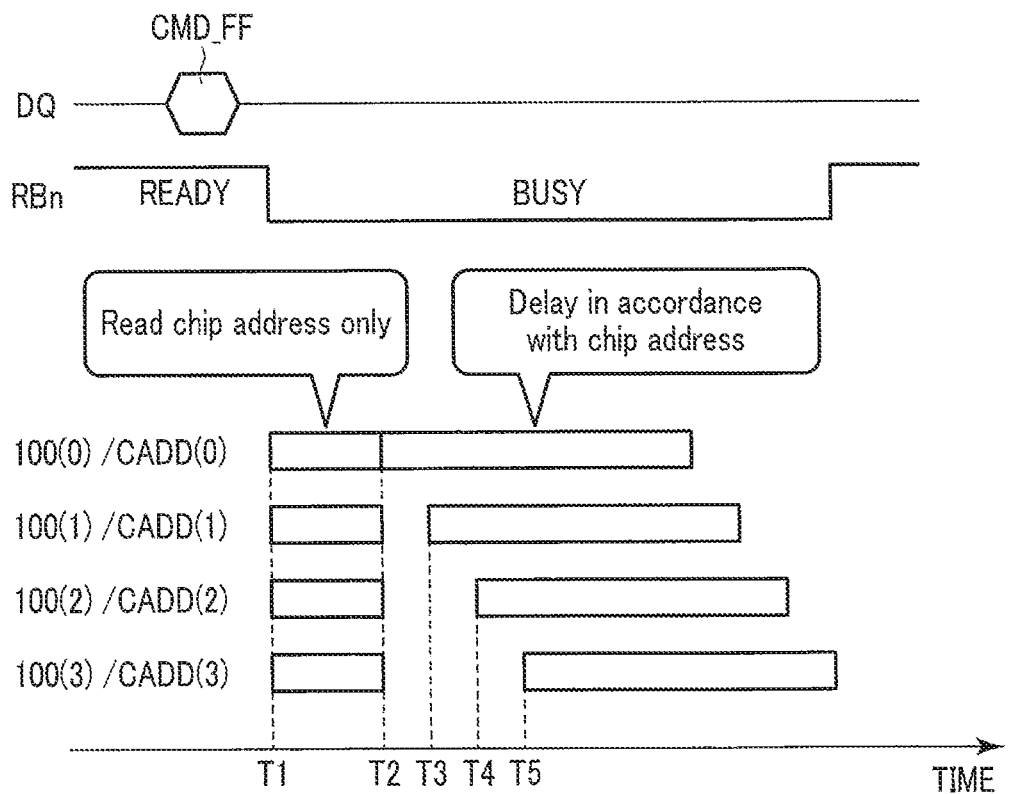
FIG. 27 is a diagram showing an operation (POR) according to the fourth embodiment.

The operation according to the fourth embodiment is described, with reference to FIGS. 26 and 27. FIG. 26 is a diagram showing an operation (POR) according to a comparative example. FIG. 26 shows an operation of four memory chips 100(0) for easy understanding. FIG. 27 is a diagram showing an operation (POR) according to the fourth embodiment. FIG. 27 shows an operation of four memory chips 100(0) for easy understanding.

As shown in FIG. 26, in a POR operation, when the package 11 receives a command CMD_FF, the memory chips 100(0) to 100(3) included in the package 11 perform a POR operation simultaneously. In this case, a power consumption in the memory system 1 may increase. From the viewpoint of saving the power consumption in the memory system 1, it is sometimes desirable to suppress the number of the memory chips 100 that simultaneously operate.

As shown in FIG. 27, in the present embodiment, if each memory chip 100 receives a command CMD_FF in a POR operation, only the reading of a chip address CADD is performed. The delay circuit 140 included in each memory chip 100 determines the chip address CADD that is read and output to the address register 1042. The delay circuit 140 causes the sequencer 105 to perform a POR operation other than the reading of a chip address CADD at a timing in accordance with a chip address CADD.

<4-3> Effects

As shown in FIG. 27, suppose the memory chip 100(0) has a chip address CADD(0), the memory chip 100(1) has a chip address CADD(1), the memory chip 100(2) has a chip address CADD(2), and the memory chip 100(3) has a chip address CADD(3). The delay circuit 140 is set in such a manner that the chip addresses CADD(0) to CADD(3) are operated in the order (time T2 to T5), for example. In this case, as shown in FIG. 27, the timing of a POR operation other than the reading of a chip address CADD varies between the memory chips 100. It is thus possible to suppress an increase in a power consumption in the memory system 1.

<5> Fifth Embodiment

Next, the fifth embodiment is described. In the fifth embodiment, an example where a memory chip 100 has a unique number-generating circuit is described. Descriptions of portions similar to those of the foregoing embodiments are omitted. The fifth embodiment can be combined with the first to fourth embodiments.

<5-1> Configuration of Memory Chip

Figure 28:
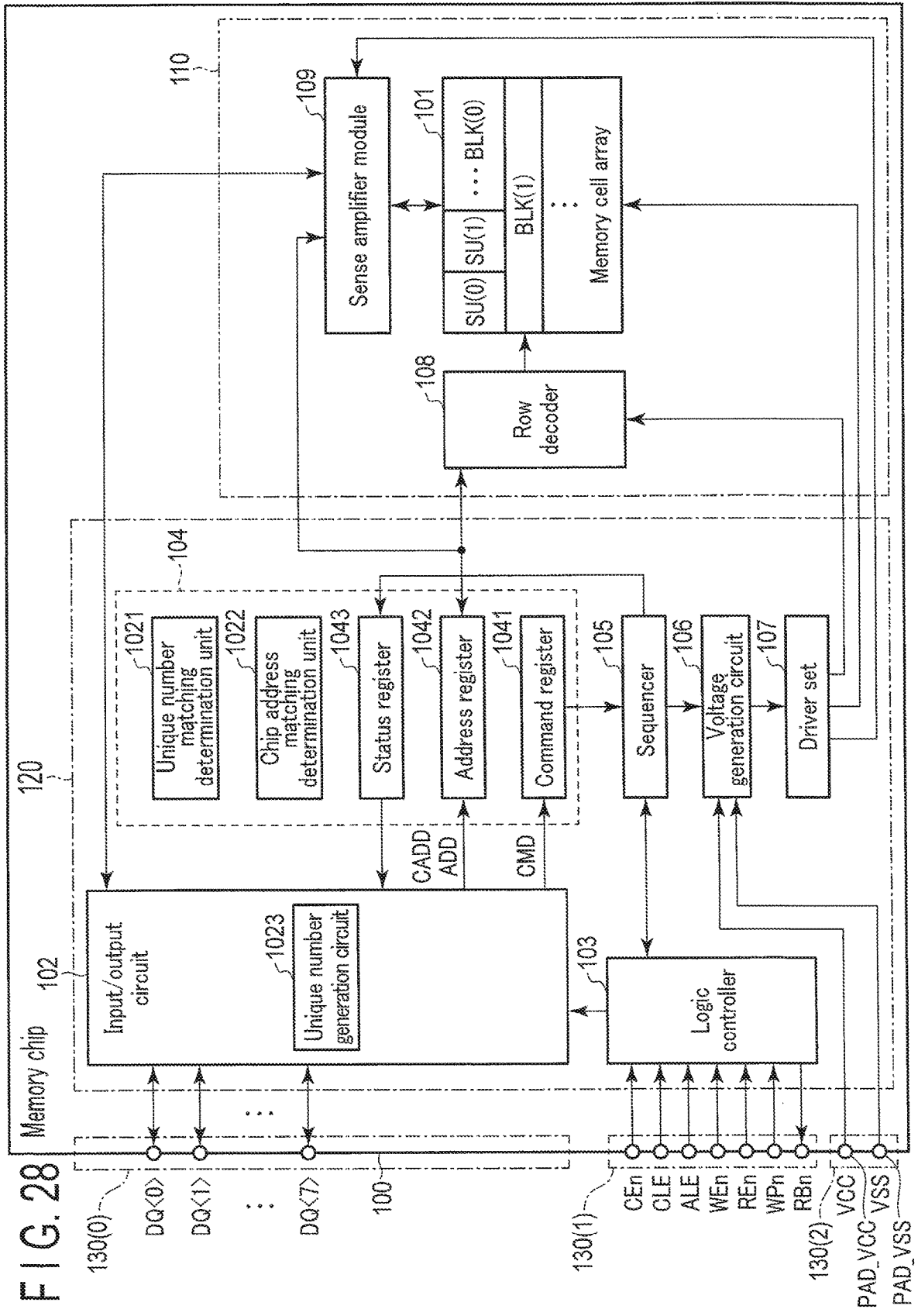
FIG. 28 is a block diagram showing an example of the configuration of a memory chip according to a fifth embodiment.

Next, a configuration example of the memory chip 100 according to the fifth embodiment is described. FIG. 28 is a block diagram showing the configuration example of the memory chip 100 according to the fifth embodiment.

As shown in FIG. 28, the input/output circuit 102 includes a unique number generation circuit 1023. The unique number generation circuit 1023 can acquire a unique number with the memory chip 100. The unique number generation circuit 1023 is for example a random number generating circuit. It is necessary for this random number generating circuit to generate the same random number even when the power source of the memory chip 100 is turned on again.

<5-2> Manufacturing Method and Using Method

In the foregoing first to fourth embodiments, the unique numbers are not determined in the memory chips 100 but are externally determined. According to the present embodiment, however, the memory chip 100 can generate a unique number on its own. For this reason, an operation relating to a unique number generation can be skipped in the above-described method of manufacturing the memory system 1.

Figure 29:
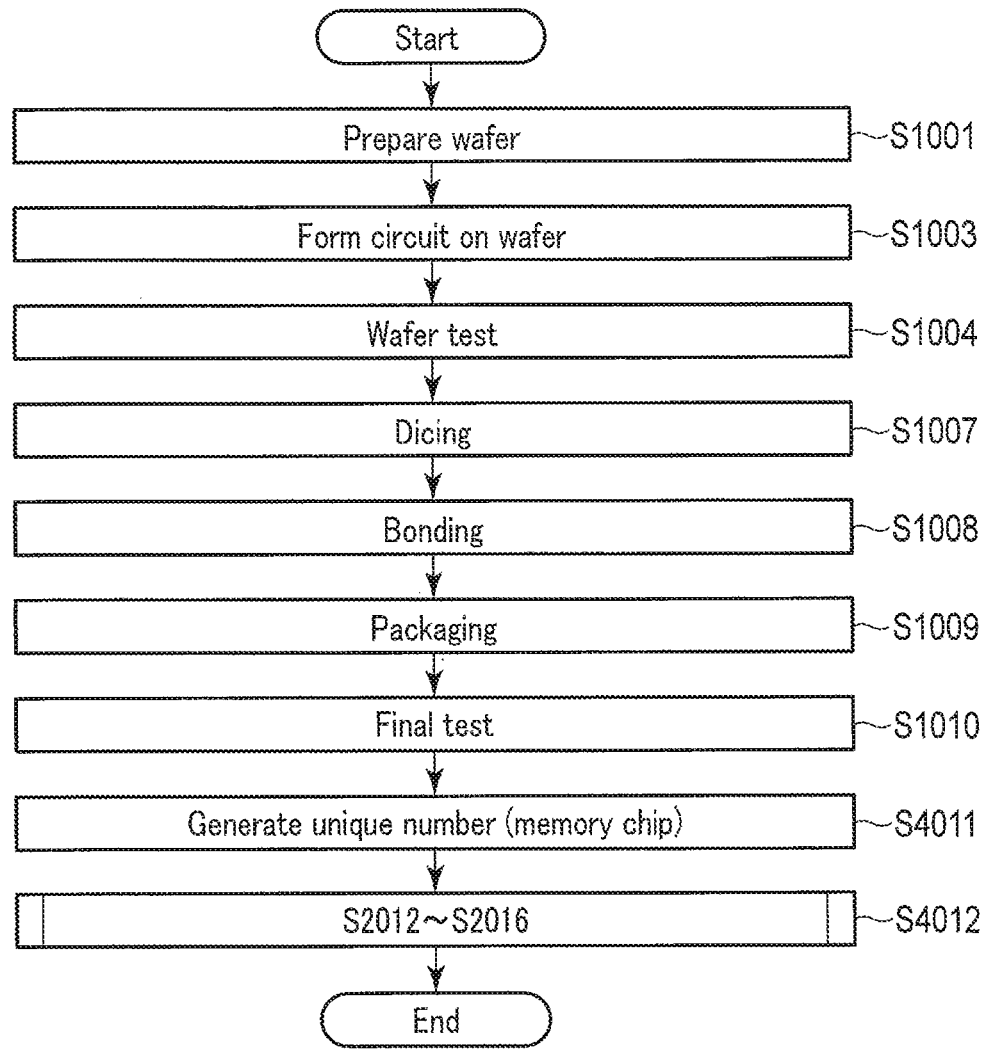
FIG. 29 is a flowchart illustrating a method of manufacturing a memory system and a method of using a memory system.

A method of manufacturing the memory system 1 and a method of using the memory system 1 are described, with reference to the flowchart shown in FIG. 29.

FIG. 29 is a flowchart illustrating a method of manufacturing the memory system 1 and a method of using the memory system 1.

[S1001], [S1003], [S1004], and [S1007]-[S1010]

Steps S1001, S1003, S1004, and S1007 to S1010 are the same as those described in the first embodiment.

[S4011]

The unique number generation circuit 1023 generates a unique number before an external device (e.g., the controller 20) determines a unique number. For example, the unique number generation circuit 1023 generates a unique number upon receipt of a command CMD_LL such as the one explained in the second embodiment. The unique number matching determination unit 1021 determines whether or not an externally received unique number matches the unique number generated by the unique number generation circuit 1023.

[S4012]

Steps S2012 to S2016 are the same as those described in the second embodiment.

<5-3> Modifications

The fifth embodiment can be combined with the third embodiment.

Specifically, the determination of a unique number may be performed using the dichotomy circuit 272 explained in the third embodiment.

In this case, the manufacturing method and using method of a memory system 1 are similar to the flow shown in FIG. 30.

[S1001], [S1003], [S1004], and [S1007]-[S1010]

Steps S1001, S1003, S1004, and S1007 to S1010 are the same as those described in the first embodiment.

[S4011]

Step S4011 is the same as that described in the fifth embodiment.

[S4013]

Steps S3012 and S2013 to S2016 are the same as those described in the third embodiment.

<6> Sixth Embodiment

Next, the sixth embodiment is described. In the sixth embodiment, an example where a memory system comprises a structure which allows a manufacturer to check with the naked eye which memory chip 100 is operating is described. Descriptions of portions similar to those of the foregoing embodiments are omitted. The sixth embodiment can be combined with the first to fifth embodiments.

<6-1> Configuration of Package

Figure 31:
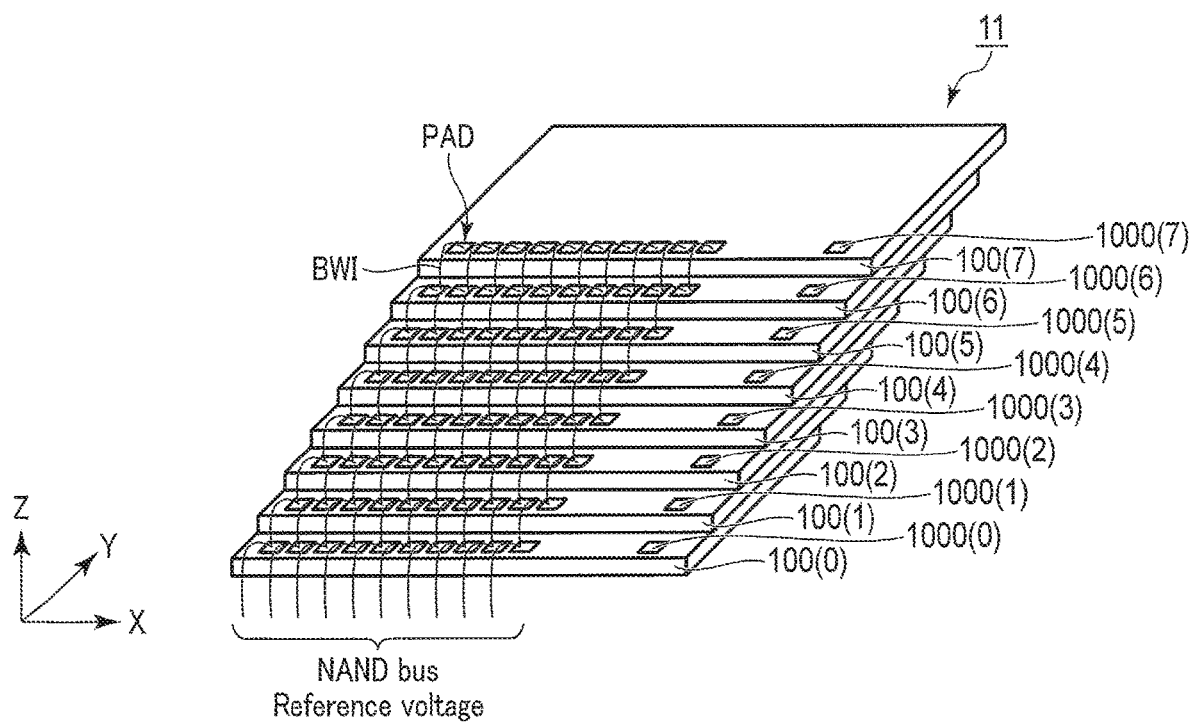
FIG. 31 is a block diagram showing an example of a configuration of a package according to a sixth embodiment.

Next, a configuration example of the package 11 according to the sixth embodiment is described with reference to FIG. 31. FIG. 31 is a block diagram showing an example of a configuration of a package 11 according to the sixth embodiment. For easy understanding, only one package 11 is explained with reference to FIG. 31.

As shown in FIG. 31, a plurality of memory chips 100 included in the package 11 are stacked in a stepwise manner. Furthermore, the plurality of memory chips 100 are arranged in such a manner that a plurality of pads (ten pads in FIG. 31 for simplification) that are arranged on the edge of each memory chip 100 and a light emitting unit 1000 are exposed.

The light emitting unit 1000 is provided in each memory chip 100. The light emitting unit 1000 may be a light emitting diode (LED) or thermochromic paint, for example. If the light emitting unit 1000 is an LED, the memory chip 100 is controlled to emit light when a read operation, a write operation, or an erase operation is performed. If the light emitting unit 1000 is thermochromic paint, the color of the paint changes as the temperature of the memory chip 100 rises when a read operation, a write operation, or an erase operation is performed, and whether or not a memory chip 100 is operating can be determined with the naked eye.

<6-2> Effects

As described above, the memory chips 100 included in the package 11 are coupled in common, and therefore it is difficult to know a chip address CADD of a memory chip 100 from its outer appearance. For this reason, it is sometimes difficult to determine which memory chip 100 is operating at the time of examining a package 11, for example. With the light emitting unit 1000 being provided, it is possible to check which memory chip 100 is operating with the naked eye. As a result, efforts required for examining a package 11 can be greatly saved.

<7> Others

FIG. 3 shows an example where the signal CEn of all memory chips 100 included in a package 11 are coupled in common by bonding wires; however, the embodiments are not limited to this example. The signal CEn of some of the memory chips 100 in a package 11 may be coupled in common and the signal CE of the other memory chips 100 in the package 11 may be separately coupled in common. For example, as shown in FIG. 32, if eight sheets of the memory chip 100 are stacked, the signal CEn of the four lower sheets (the memory chip 100(0) to 100(3)) may be coupled in common and the signal CEn may be supplied thereto, and the signal CEn of the four upper sheets (the memory chips 100(4) to 100(7)) may be coupled in common and the signal CEn1, which is independent from the signal CEn0, may be supplied thereto.

For example, if the number of memory chips 100 coupled to a single signal CEn increases, an active current when the signal CEn is enabled may be increased or a multi-chip operation (an operation of operating memory chips 100 in parallel) may be restricted.

If the number of the memory chips 100 coupled to a single signal CEn increases, it may be possible to cut down the need for switching of the signal CEn by a client and suppress an increase in manufacturing costs.

Figure 32:
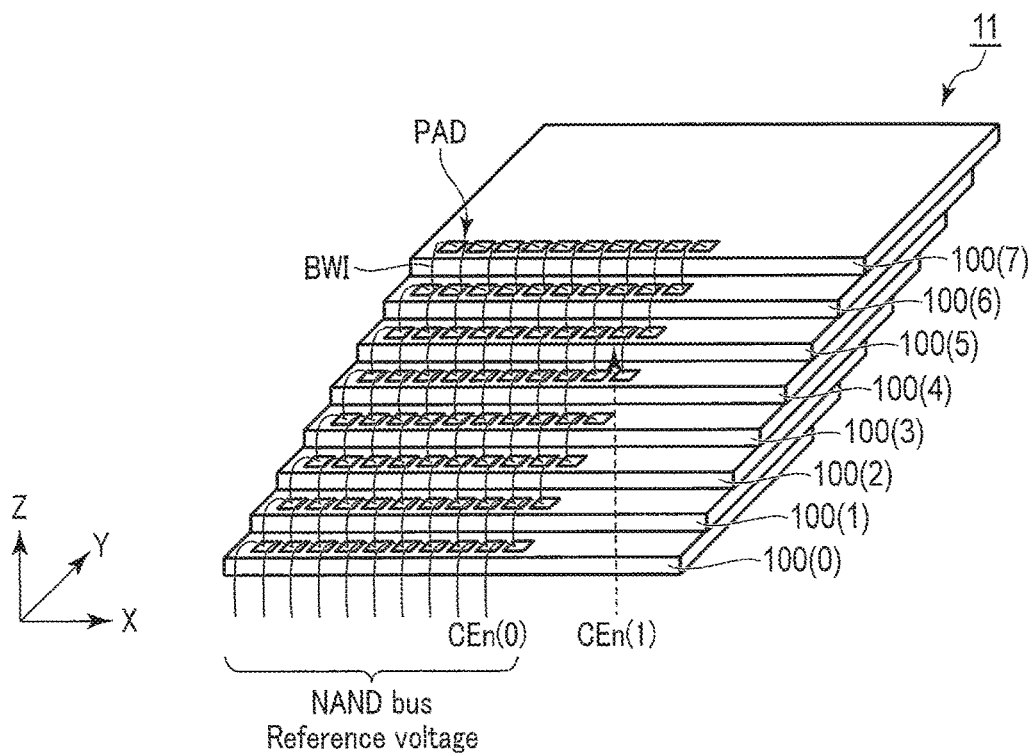
FIG. 32 is a block diagram showing an example of a relationship between memory chips included in a package according to a comparative example.

As shown in FIG. 32, if the signal CEn is divided in the package 11, it is still possible for a client to short-circuit the signal CEn outside or in the package 11. In this case, an increase of an active current when the signal CEn is enabled can be suppressed, and restrictions on a multi-chip operation can be removed, and the need for switching of the signal CEn can be cut down.

Even though the memory chips 100 are physically included in the same package 11, if the signals CEn are mutually independent, a group of memory chips 100 sharing the signal CEn can be regarded as a package 11 that is virtually (electrically or functionally) independent. The "package" in each of the foregoing embodiments refers not only to memory chip groups that are physically integrally stacked but also to those functionally (electrically) integrally coupled by sharing a signal CEn.

Figure 33:
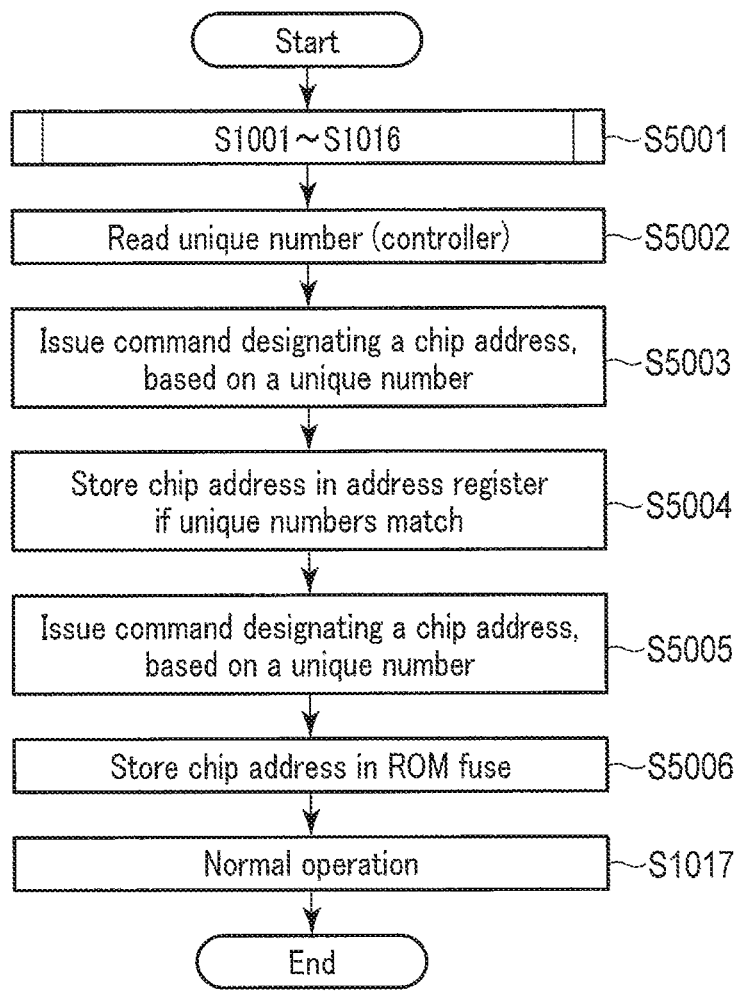
FIG. 33 is a flowchart illustrating a method of manufacturing a memory system and a method of using a memory system.

As shown in FIG. 33, the same flow as that explained with reference to FIG. 6 can be performed under the supervision of a client, and that renders possible the reassignment of a chip address CADD by the client.

[S5001]

Steps S1001 to S1016 described with reference to FIG. 6 are performed.

[S5002]

It is necessary for a client to know unique numbers. As an example, a client can know unique numbers when the unique numbers of all memory chips 100 in the package 11 are written to the first memory chip 100 (e.g., memory chip 100(0)) when a final test is conducted (S1010).

In step S5002, the controller 20 issues to the memory chip 100 a command sequence for reading and outputting a unique number stored in a block BLK(x) of a memory cell array 101 in step S1006 to the unique number register 1044.

Then, the controller 20 reads a unique number corresponding to a memory chip 100 for which a wafer test is conducted from the first memory chip 100.

[S5003]

In step S5003, the controller 20 issues a command sequence for writing to the address register 1042 a chip address CADD determined based on the unique number assigned to the memory chip 100 in step S1002.

[S5004]

In step S5004, a chip address is written in the address register 1042. Specifically, the memory chip 100 determines whether or not unique numbers match each other when receiving the command sequence issued in step S5003. If the unique numbers match, the unique number matching determination unit 1021 stores in the address register 1042 the chip address included in the same command sequence as the command sequence that includes the matching address.

In step S5005, the controller 20 issues a command sequence for writing to the ROM fuse a chip address CADD determined based on the unique number assigned to the memory chip 100 in step S1002.

[S5006]

In step S5006, a chip address is written in the ROM fuse. Specifically, the memory chip 100 determines whether or not unique numbers match each other when receiving the command sequence issued in step S5005. If the unique numbers match, the unique number matching determination unit 1021 stores in the ROM fuse the chip address included in the same command sequence as the command sequence that includes the matching address.

Steps S5005 and S5006 may be omitted.

[S1017]

Step S1017 described with reference to FIG. 6 is performed.

As described above, it is possible to assign a chip address CADD at a client's discretion after shipping.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a NAND string;
a first storage circuit configured to store:
a first unique number uniquely assigned; and
a first chip address having a bit number smaller than that of the first unique number and used to identify the semiconductor memory device from other semiconductor memory devices; and
a first determination circuit configured to externally receive a first command set including a second unique number and a second chip address, and to write the second chip address to the first storage circuit as the first chip address when the second unique number matches the first unique number.

2. The semiconductor memory device according to claim 1, further comprising:
a controller; and
a second determination circuit configured to externally receive a second command set including a third chip address, and to cause the controller to execute a command included in the second command set when the third chip address matches the first chip address.

3. The semiconductor memory device according to claim 1, wherein the device is enabled when a first signal is externally received.

4. The semiconductor memory device according to claim 2, further comprising:
a first register,
wherein the controller is configured to:
read the first unique number from the first storage circuit upon receiving a first command; and
store the read first unique number in the first register.

5. The semiconductor memory device according to claim 4, wherein the first determination circuit is configured to determine whether the first unique number and the second unique number match using the first unique number stored in the first register.

6. The semiconductor memory device according to claim 1, wherein a first command set includes a second command, the second unique number, a third command, and the second chip address in this order.

7. The semiconductor memory device according to claim 2, further comprising:
a second register,
wherein the controller is configured to:
read the first chip address from the first storage circuit upon receiving a fourth command; and
store the read first chip address in the second register.

8. The semiconductor memory device according to claim 7, wherein the controller is configured to delay a timing of executing an operation after storing the read first chip address in accordance with the second chip address.

9. The semiconductor memory device according to claim 7, wherein the second determination circuit is configured to determine whether the first chip address and the second chip address match using the first chip address stored in the second register.

10. The semiconductor memory device according to claim 2, wherein the controller is configured to externally receive a first signal toggling a plurality of times, and to change a second signal from a first state to a second state when the first signal toggles the first unique number of times.

11. A memory system, comprising:
a first package comprising memory chips including a first memory chip and a second memory chip;
a controller configured to control the first package; and
a bus that electrically connects the controller to the first package,
wherein:
the first memory chip and the second memory chip are obliquely stacked,
the first memory chip and the second memory chip each have a plurality of pads, and the pads of the first memory chip are connected to the pads of the second memory chip, respectively,
the first memory chip and the second memory chip each have a first unique number that is uniquely assigned to each of the memory chips and a first chip address having a bit number smaller than that of the first unique number and used to identify one of the memory chips from other memory chips,
the controller is configured to supply a first command set that includes a second unique number and a second chip address to the memory chips, and
the first memory chip and the second memory chip each store the second chip address as the first chip address when the second unique number matches the first unique number.

12. The memory system according to claim 11, wherein the first memory chip and the second memory chip each control an operation timing based on the first chip address.

13. The memory system according to claim 11, further comprising:
a second package comprising a third memory chip and a fourth memory chip,
wherein:
the third memory chip and the fourth memory chip each have a plurality of pads, and the pads of the first to fourth memory chips are connected in common to each other, and
the third memory chip and the fourth memory chip each have a first unique number that is uniquely assigned to each of the memory chips and the third and fourth memory chips and a first chip address having a bit number smaller than that of the first unique number and used to identify one of the memory chips and the third and fourth memory chips from other memory chips.

14. A memory system, comprising:
a first package comprising memory chips including a first memory chip and a second memory chip;
a controller configured to control the first package; and
a bus that electrically connects the controller to the first package,
wherein:
the first memory chip and the second memory chip each have a plurality of pads, and the pads of the first memory chip are connected to the pads of the second memory chip, respectively,
the first memory chip and the second memory chip each have a first unique number that is uniquely assigned to each of the memory chips and a first chip address having a bit number smaller than that of the first unique number and used to identify one of the memory chips from other memory chips,
the controller supplies a second command set that includes a third chip address and a command to the memory chips, and
each of the memory chips executes the command when the third chip address matches the first chip address.

* * * * *